(12) United States Patent
Kawasaki et al.

(10) Patent No.: US 7,306,508 B2
(45) Date of Patent: Dec. 11, 2007

(54) MULTI-WIRE SAW

(75) Inventors: Takafumi Kawasaki, Tokyo (JP);
Hirozoh Tsuruta, Tokyo (JP);
Hirokazu Nishida, Tokyo (JP); Seiichi Mimura, Tokyo (JP); Masayuki Hamayasu, Tokyo (JP); Hisashi Tominaga, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 0 days.

(21) Appl. No.: 10/540,020

(22) PCT Filed: Oct. 22, 2004

(86) PCT No.: PCT/JP2004/015705

§ 371 (c)(1),
(2), (4) Date: Jun. 22, 2005

(87) PCT Pub. No.: WO2005/039824

PCT Pub. Date: May 6, 2005

(65) Prior Publication Data

US 2006/0249134 A1   Nov. 9, 2006

(51) Int. Cl.
*B24B 49/00* (2006.01)
*B28D 1/06* (2006.01)

(52) U.S. Cl. .......................... 451/7; 451/60; 451/446; 125/16.02

(58) Field of Classification Search ............... 451/7, 451/53, 33, 36, 60, 446; 125/16.01, 16.02, 125/19, 21
See application file for complete search history.

(56) References Cited

U.S. PATENT DOCUMENTS 5,827,113 A * 10/1998 Okuno et al. ............... 451/36
6,006,737 A * 12/1999 Hayashi et al. .......... 125/16.02
6,006,738 A * 12/1999 Itoh et al. .................... 125/21
6,390,896 B1 * 5/2002 Huber et al. ................. 451/59
6,832,606 B2 * 12/2004 Yamada et al. .......... 125/13.01

FOREIGN PATENT DOCUMENTS

| JP | 61-284926 | 12/1986 |
|----|-----------|---------|
| JP | 2-262955 | 10/1990 |
| JP | 2-298280 | 12/1990 |
| JP | 5-212720 | 8/1993 |
| JP | 9-099432 | 4/1997 |

(Continued)

*Primary Examiner*—Dung Van Nguyen
(74) *Attorney, Agent, or Firm*—Buchanan Ingersoll & Rooney PC

(57) ABSTRACT

A multi-wire saw according to the present invention cuts a workpiece while supplying a slurry containing an alkali or mixed acid to a cutting interface between the workpiece and a wire, and includes: a storage tank with a heating mechanism for storing and heating the slurry; a thermal insulating pipe for transporting the slurry sent with a pump from the storage tank with a heating mechanism to a position before a position where the wire is incorporated into the workpiece, while keeping the slurry at a predetermined temperature; a thermostat for keeping a temperature in a vicinity of the workpiece fixed to a stage at the predetermined temperature; and a wire heating mechanism for heating the wire to the predetermined temperature. Consequently, the cutting resistance decreases during cutting machining of a silicon ingot, and the variation in the cutting resistance also decreases, whereby a high-quality wafer can be obtained at a high efficiency and a low cost.

4 Claims, 18 Drawing Sheets

FOREIGN PATENT DOCUMENTS

| | | |
|---|---|---|
| JP | 9-262829 | 10/1997 |
| JP | 10-180750 | 7/1998 |
| JP | 11-042551 | 2/1999 |
| JP | 3071100 | 5/2000 |
| JP | 2000-343525 | 12/2000 |
| JP | 2001-079747 | 3/2001 |
| JP | 3187296 | 5/2001 |

* cited by examiner (A)

(B)

MULTI-WIRE SAW

RELATED APPLICATIONS

This application claims priority under 35 U.S.C. §119 to Japanese Application Nos. 2003-365719, 2003-366378, 2003-369476, and 2003-370859, filed Oct. 27, 2003, Oct. 27, 2003, Oct. 29, 2003, and Oct. 30, 2003, respectively, and under 35 U.S.C. §371 to PCT Application No. PCT/JP2004/015705 filed as an International Application on Oct. 22, 2004 designating the U.S., the entire contents of which are hereby incorporated by reference in their entireties.

TECHNICAL FIELD

The present invention relates to a multi-wire saw used for cutting a silicon ingot so as to produce a wafer for a semiconductor and a solar battery.

BACKGROUND ART

Conventionally, in order to cut a silicon ingot, a multi-wire saw is used, which is capable of cutting with a small cutting allowance and a uniform thickness, and capable of cutting a number of wafers at a time. Such cutting of a silicon ingot using a multi-wire saw is performed by introducing a slurry containing abrasive grains into a cutting interface while pressing a silicon ingot against a traveling wire (for example, see Patent Document 1).

In the cutting of a silicon ingot using a wire, the temperature of the slurry increases along with the proceeding of the cutting of an ingot with the wire, and a roller of the wire saw expands/contracts. The machining conditions for the ingot vary, which makes it impossible to maintain the machining precision of an ingot constant. Therefore, an attempt is made to ensure the machining precision by cooling the slurry (for example, see Patent Document 2).

However, recently, there is a demand with respect to the cutting of a silicon ingot, for reducing a wafer machining cost by decreasing a cutting allowance and a cutting pitch while maintaining the high quality of a wafer. In order to decrease the cutting allowance, the diameter of a wire may be decreased. In this case, the breakage strength of the wire also decreases accordingly, which makes it necessary to decrease the tension applied to the wire. An ingot is cut by a lapping action that is a pressure transfer. Therefore, when the tension of the wire is decreased, the cutting speed becomes low, and the displacement (deformation) of the wire increases. When the displacement (deformation) of the wire increases, the displacement of the wire in a direction orthogonal to the cutting direction also increases, with the result that the warpage, irregular thickness, and minute unevenness (saw marks) occur, decreasing the quality of the wafer. When the feeding speed of a silicon ingot is decreased in accordance with the delay in the cutting speed in order to decrease such warpage of the wire, the cutting efficiency decreases. When the feeding speed of a silicon ingot is increased by increasing the feeding speed of a wire so as to compensate for the delay in the cutting speed, a margin with respect to a dispersion defect of abrasive grains at the cutting interface is lost, and the wire breaks owing to the abrupt increase in tension. Thus, in order to maintain the high quality of a wafer, and decrease the cutting allowance and cutting pitch of a silicon ingot, it is necessary to reduce the cutting resistance.

A method of cutting a silicon ingot using a fixed abrasive grain wire and a slurry containing free abrasive grains or a KOH alkaline solution in concentration of 2% or less has been proposed (for example, see Patent Document 3).

On the other hand, in the multi-wire saw, when the slurry is supplied to the wire, a large amount of slurry in a curtain shape is discharged from above the wire. A very small amount of the supplied slurry adheres to the wire, and most of the slurry drops below the wire. Therefore, the dropped slurry is collected by a slurry storage tank via a drain pulled out of a machining chamber floor portion. More specifically, most of the slurry is not used for cutting a silicon ingot, and is merely circulated to the slurry storage tank via a slurry supply path and a discharge mechanism from the slurry storage tank. Generally, in the multi-wire saw, the machining chamber is kept in a negative pressure state so as to discharge hydrogen generated by reaction. Therefore, water contained in the slurry is evaporated in the course of supply and circulation of the slurry. In particular, when the temperature of the slurry to be used is high, water is evaporated remarkably, the viscosity of the slurry supplied and circulated becomes high, and the excess slurry that is not introduced to the cutting interface is dried and solidified in an inlet portion through which the wire is inserted in the silicon ingot. The change in the viscosity of the slurry causes a decrease in machining quality (variation in wafer thickness, generation of saw marks). Furthermore, when the solidified slurry is accumulated in the inlet portion through which the wire is inserted in the silicon ingot, the resistance is generated between the wire and the slurry, or chips of the solidified slurry are interposed at the cutting interface between the wire and the silicon ingot, which may eventually lead to the breakage of the wire. When the wire breaks during machining, not only the machining is interrupted but also the silicon ingot that is being machined is wasted. In order to resume the machining, man-hours are required for a collection operation of a silicon ingot, a cleaning operation, a wire stretching operation, and the like, resulting in a significant decrease in productivity.

Patent Document 1:JP 3187296 B

Patent Document 2:JP 08-47850 A

Patent Document 3:JP 2000-343525 A

DISCLOSURE OF THE INVENTION

Problems to be Solved by the Invention

According to a conventional cutting method using a fixed abrasive grain wire and free abrasive grains, a fixed wire is used as a medium for transporting free abrasive grains, and an average introduction amount of free abrasive grains is increased by reducing the unsteadiness in the introduction amount of free abrasive grains to the cutting interface, and fixed abrasive grains are allowed to act simultaneously so as to cut a silicon ingot by lapping. An increase in a so-called number of cutting teeth in cutting is expected, and the cutting efficiency is increased to decrease the apparent cutting resistance. However, compared with the case of using a bare wire, it is difficult to discharge cuttings and free abrasive grains, and the concentrations of cuttings and free abrasive grains in the liquid increase at the cutting interface, with the result that the viscosity of a slurry at the cutting interface becomes high. Furthermore, the fixed abrasive grain wire is very expensive, so that the use thereof is extremely uneconomical.

According to a conventional cutting method using fixed abrasive grains and an alkaline solution, cuttings clog at the cutting interface, and a part of an alkaline solution is used for dissolution of the cuttings. Therefore, the function of the alkaline solution with respect to the cut surface decreases. Furthermore, coagulated cuttings may give minute cracks to the cut surface, and the alkaline solution selectively functions so as to enlarge such cracks, which roughens the cut surface. The cuttings discharge resistance contributes to an increase in the cutting resistance, which consequently causes the warpage of a wafer, irregular thickness, and minute unevenness. In order to obtain a sufficient function of the alkaline solution, it is necessary to significantly decrease the feeding speed of a wire and the feeding speed of a silicon ingot, which markedly decreases the cutting efficiency.

In view of this, a slurry containing abrasive grains and several % by mass of basic material and having a pH of 12 or more was heated and supplied to a cutting interface, and an ingot was cut while being pressed against a bare wire; as a result, it was found that the cutting resistance can be decreased by such an operation. In particular, it was found that the heating temperature for a slurry is preferably 65° C. to 95° C. In order to obtain the effect of reducing the cutting resistance, it is important to control the temperature of a slurry which is to be introduced or has been introduced to the cutting interface to a predetermined temperature.

According to a conventional cutting method disclosed in Patent Document 2, although the temperature of a slurry is adjusted in a slurry storage tank, the temperature of the slurry decreases at a chemical reaction portion between the slurry and the ingot because the temperature of the slurry decreases while the slurry is being transported from the slurry storage tank to a slurry discharge portion, or the heat of the slurry is absorbed by a wire when the slurry is applied to the wire, or the heat of the slurry is absorbed by an ingot when the slurry applied to the wire comes into contact with the ingot. Such a decrease in temperature of the slurry causes a phenomenon in which the chemical reaction speed varies depending upon the position at the chemical reaction interface between the ingot and the slurry, and as a result, the cutting resistance varies, which causes saw marks and irregular thickness of a wafer.

Furthermore, there are the following problems in the conventional cutting methods.

(1) An apparatus becomes expensive because a large amount of slurry is supplied and circulated, which necessitates a slurry supply mechanism with a large flow rate and a large power.

(2) A decrease in an amount of abrasive grains in a slurry introduced to an ingot cutting interface and a change in viscosity of the slurry are likely to occur owing to the change in a composition (decrease in water and abrasive grains, and phase separation of a liquid component) during circulation, with the result that the machining quality varies.

(3) The man-hours required for cleaning after an operation increase because the slurry scatters largely in a machining chamber, and the machining chamber is stained significantly.

(4) In the management of the temperature of a slurry, the temperature of a slurry circulated in a large amount without contributing to cutting must be controlled, which degrades the response of the temperature control of the slurry introduced to the cutting interface. Furthermore, uniform dispersibility of abrasive grains is not obtained even if a large amount of slurry collected successively in a tank is stirred, and the slurry is applied to a wire in a non-uniform state, which degrades the machining quality (variation in wafer thickness, generation of saw marks (scratches), etc.).

The present invention has been achieved in view of the above, and its object is to provide a multi-wire saw capable of decreasing the cutting resistance during cutting machining of a silicon ingot, and decreasing the variation in the resistance.

It is another object of the present invention to provide a multi-wire saw capable of suppressing the viscosity of a slurry from changing and the slurry from being dried and solidified in an inlet portion through which a wire is inserted in a silicon ingot, thereby maintaining high machining quality and preventing the breakage of a wire.

It is still another object of the present invention to provide a multi-wire saw in which the utilization efficiency of a slurry is high, an apparatus configuration is inexpensive, the control of the temperature of a slurry is easy, the life of a rotation roller can be prolonged, and the workability of a cleaning and wire stretching operation and the like is satisfactory.

Means for Solving the Problem

The present invention provides a multi-wire saw for cutting a workpiece while supplying a slurry containing an alkali or mixed acid to a cutting interface between the workpiece and a wire, including: a storage tank with a heating mechanism for storing and heating the slurry; a thermal insulating pipe for transporting the slurry sent with a pump from the storage tank with a heating mechanism to a position before a position where the wire is incorporated into the workpiece, while keeping the slurry at a predetermined temperature; a thermostat for keeping a temperature in a vicinity of the workpiece fixed to a stage at the predetermined temperature; and a wire heating mechanism for heating the wire to the predetermined temperature.

Further, the present invention provides a multi-wire saw for cutting a workpiece while supplying a slurry to a wire traveling between a plurality of rollers, including: a slurry discharge part for discharging the slurry; a machining chamber covering at least the slurry discharge part and the workpiece; and a humidity adjustment mechanism for adjusting a humidity in the machining chamber to a set humidity.

Further, the present invention provides a multi-wire saw for cutting a workpiece while supplying a slurry to a wire traveling between a plurality of rollers, including: a slurry supply mechanism having a slurry discharge part placed between the roller, which is provided on an upstream side of a site where the workpiece is cut, and the site where the workpiece is cut, characterized in that the slurry discharged from the slurry discharge part moves along a side surface of the workpiece so that the slurry is supplied to the wire.

Still further, the present invention provides a multi-wire saw for cutting a workpiece while supplying a slurry containing abrasive grains to a wire traveling between a plurality of rollers, characterized in that a slurry supply mechanism having an holding portion for holding the slurry and adapted to supply the slurry to the wire as the wire passes through the holding portion is provided on an upstream side of a site where the workpiece is cut.

Effect of the Invention

According to the present invention, cutting machining can be performed while an alkaline slurry is maintained at a desired high temperature. Therefore, the variation in the reaction speed at the location of the cutting interface between the workpiece and the slurry is suppressed, and the variation in the cutting resistance is reduced, whereby saw marks, irregular wafer thickness, and the like can be suppressed.

Furthermore, according to the present invention, the viscosity in the machining chamber can be adjusted to a set humidity by the humidity adjustment mechanism, so that the breakage of a wire can be prevented while high machining quality is maintained.

Furthermore, according to the present invention, the slurry utilization efficiency is enhanced with an inexpensive apparatus configuration, the temperature of a slurry can be controlled easily, the life of the rotation roller can be prolonged, and the workability of the cleaning and wire stretching operation can be enhanced.

BEST MODE FOR EMBODYING THE PRESENT INVENTION

Embodiment 1

Figure 1:
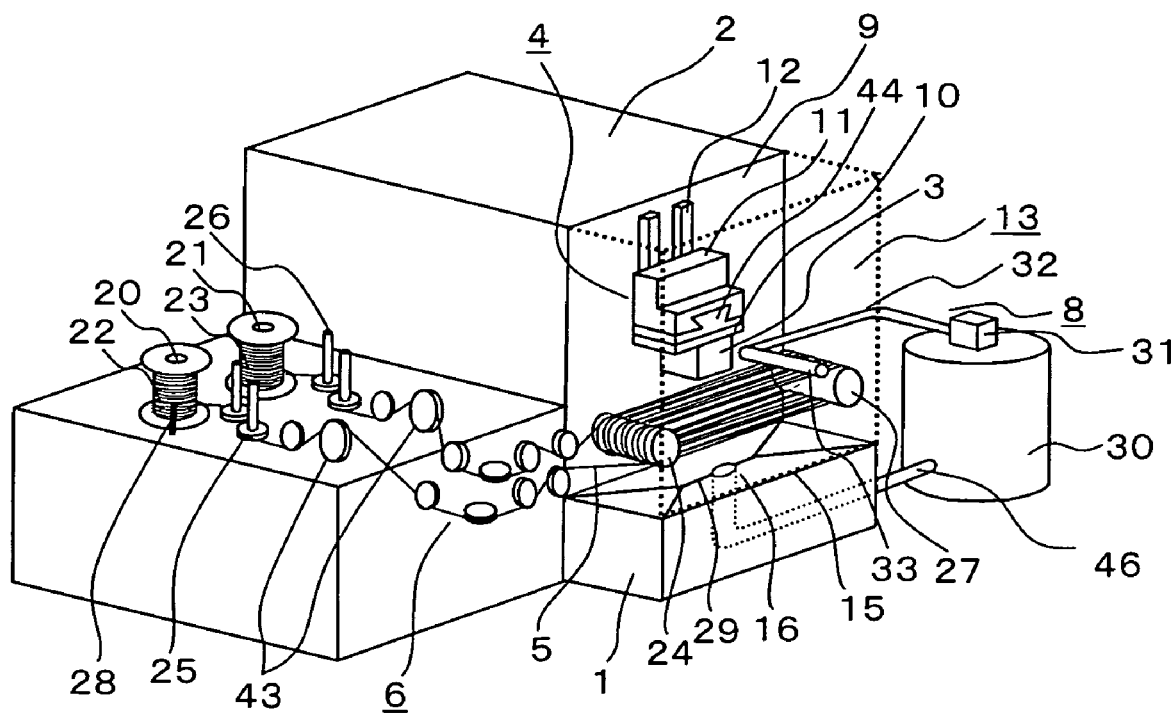
[FIG. 1] An external appearance view of a multi-wire saw according to Embodiment 1 of the present invention.
Figure 2:
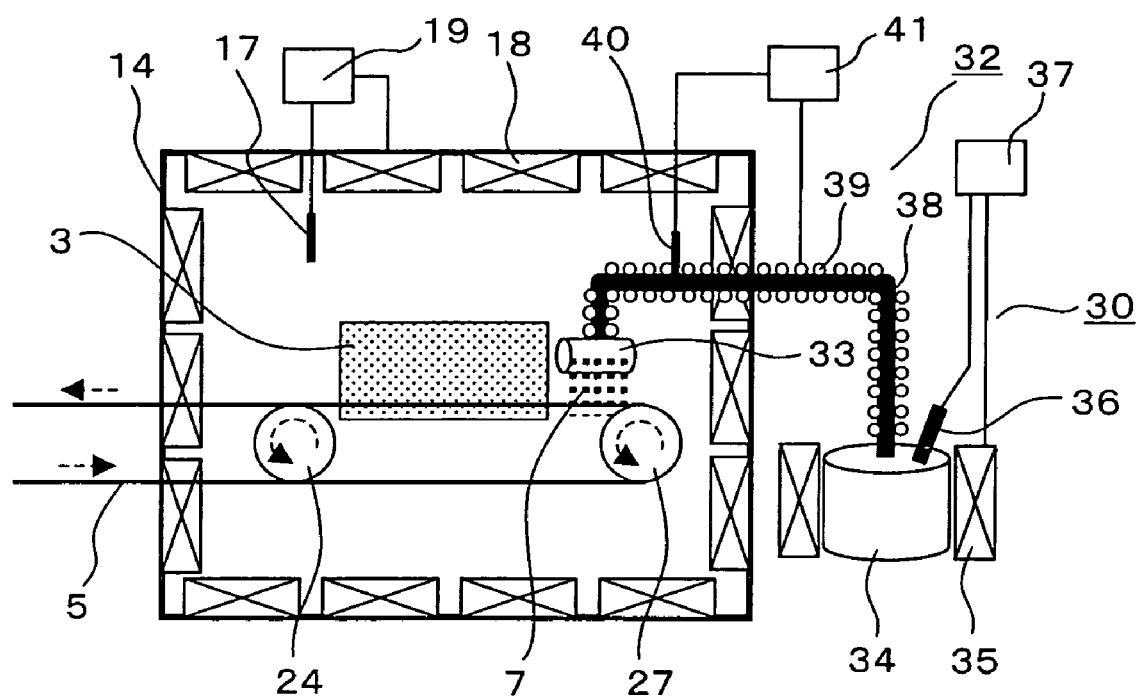
[FIG. 2] A partial external appearance view of the multi-wire saw according to Embodiment 1 of the present invention.
Figure 3:
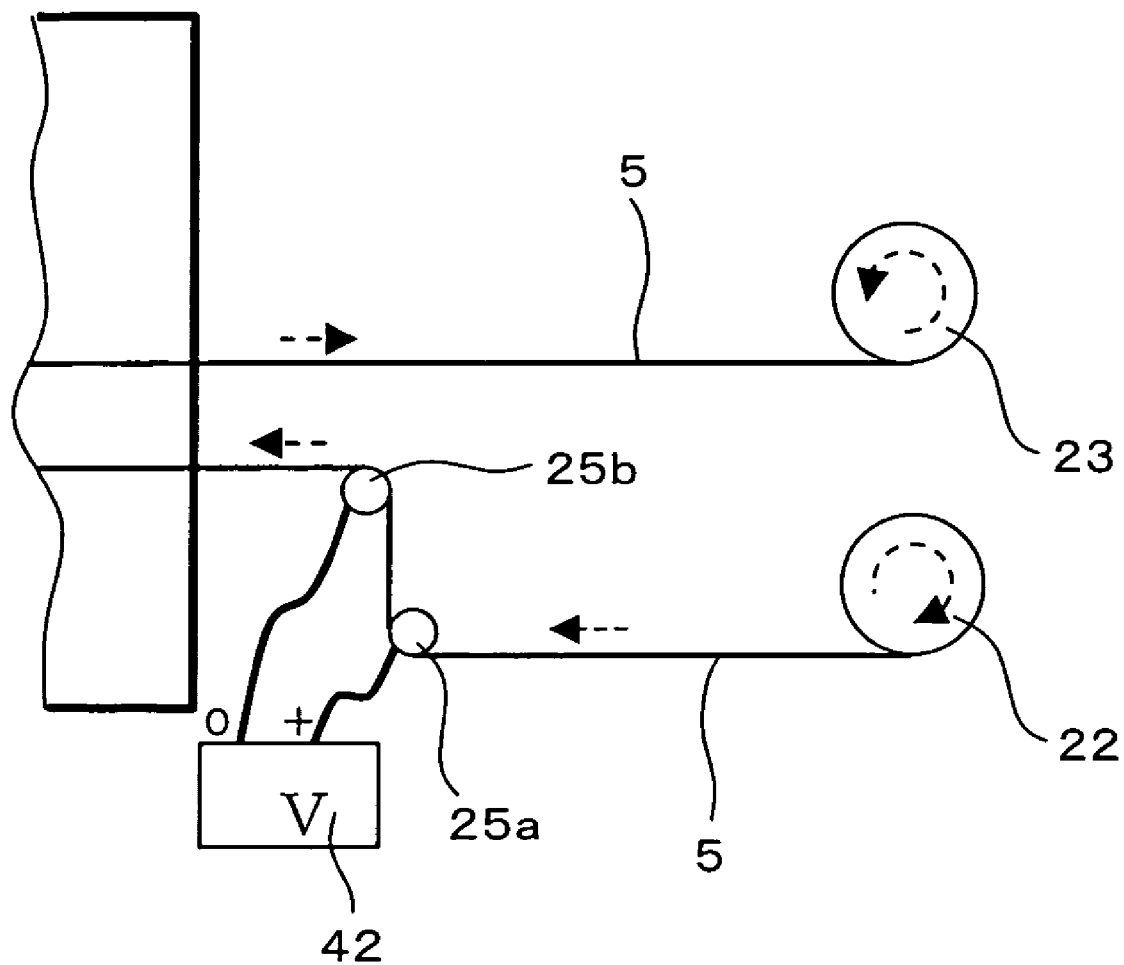
[FIG. 3] A view showing a configuration of a wire heating mechanism of a multi-wire saw according to Embodiment 2 of the present invention.

FIG. 1 is an external appearance view of a multi-wire saw according to Embodiment 1 of the present invention. FIG. 2 is a partial external appearance view of the multi-wire saw of Embodiment 1.

The multi-wire saw according to Embodiment 1 includes a base 1, a frame 2 provided upright on an upper surface of the base 1, a mechanism 4 for supporting a workpiece, which supports a workpiece 3 so that it is movable in a machining direction, a wire supply-mechanism 6 for supplying a wire 5 at a cutting portion of the workpiece 3 so that the wire 5 is incorporated into the substance 3, and a slurry supply mechanism 8 for supplying a slurry 7 at a cutting interface between the workpiece 3 and the wire 5. The base 1 is composed of a flat board supporting the multi-wire saw. The frame 2 is made of a box, and is provided with a side plate 9 opposed to an operator.

The mechanism 4 for supporting a workpiece includes a stage 11 for fixing the workpiece 3 via a dummy plate 10, a stage moving mechanism 12 supported movably with respect to the frame 2 and adapted to press down the stage 11 while applying a predetermined load to the stage 11 in the machining direction, and a thermostat 13 surrounding the periphery of the stage 11. The thermostat 13 includes a machining chamber 16 surrounded by the frame 2, four side walls 14 protruding forward from the frame 2, and a front wall 15 opposed to the frame 2 and connected to a front side of the side walls 14. The thermostat 13 further includes an indoor thermometer 17 for measuring the temperature in the machining chamber 16, a heat plate 18 for heating the inside of the machining chamber 16, and a room temperature adjuster 19 for adjusting an electrical power supplied to the heat plate 18 so that the temperature of the machining chamber becomes an optimum temperature for the slurry 7 based on the temperature measured with the indoor thermometer 17, as shown in FIG. 2.

The wire supply mechanism 6 includes two motors (not shown) provided to the base 1, an unwinding rotation shaft 20 and a take-up rotation shaft 21 connected respectively to the shafts of the motors, a wire unwinding bobbin 22 which is fitted in the unwinding rotation shaft 20 and from which the wire 5 is unwound, a wire take-up bobbin 23 which is fitted in the take-up rotation shaft 21 and takes up the wire 5 returned from the machining chamber 16, a plurality of guide pulleys 25 for guiding the travel of wire 5 unwound from the wire unwinding bobbin 22 to a main roller 24 supported on the frame 2, a plurality of guide pulleys 26 for guiding the travel of the wire 5 returned from the main roller 24 to the wire take-up bobbin 23, and a tension control roller 43 for controlling the tension of the wire 5 guided with the guide pulleys 25, 26.

Furthermore, the wire supply mechanism 6 includes a main roller 24 which is rotatably supported so as to be vertical to the frame 2, and in which a plurality of grooves are formed at an equal interval on an outer circumferential surface, and a sub-roller 27 which is rotatably supported with respect to the frame 2 so as to be parallel to the main roller 24, and in which a plurality of grooves are formed at an equal interval on an outer circumferential surface.

Furthermore, in the wire supply mechanism 6, a bobbin heater 28 as a wire heating mechanism is housed in the wire unwinding bobbin 22. As the wire heating mechanism, in place of the above, a hot water tank or the like can also be used, which is provided in the vicinity of the main roller 24, and which allows the wire 5 to pass through hot water before an infrared heater that can irradiate the wire 5 with an infrared ray or the main roller 24. The present invention is not limited thereto, as long as the wire 5 can be heated.

The slurry supply mechanism 8 includes a storage tank 30 with a heating mechanism for storing the slurry 7 supplied after being adjusted and the slurry 7 collected in a slurry receiving plate 29 in the machining chamber 16 and returned therefrom, and controlling the temperature of the slurry 7 at an appropriate temperature, a pump 31 for sending the slurry 7 from the storage tank 30 with a heating mechanism, a thermal insulating pipe 32 for allowing the slurry 7 sent from the pump 31 to pass therethrough, and to be sent to the machining chamber 16 while being kept at an optimum temperature, and a slurry discharge part 33 for discharging the slurry 7 sent via the thermal insulating pipe 32 toward the wire 5.

As shown in FIG. 2, the storage tank 30 with a heating mechanism includes a slurry storage tank 34, a heater 35 for heating a slurry for heating by surrounding the periphery of the slurry storage tank 34, a thermometer 36 for measuring the temperature of the slurry 7 in the slurry storage tank 34, and a temperature adjuster 37 for adjusting the heating condition of the heater 35 for heating a slurry based on the measured temperature of the slurry 7. As the heater 35 for heating a slurry, a heating wire is used. In place of this, anything such as a throw-in heater, a ribbon heater, or a hot water heater can be used, as long as it can heat the slurry 7.

As shown in FIG. 2, the thermal insulating pipe 32 includes a pipe 38 through which the slurry 7 can pass, a heater 39 for reserving the heat of a slurry wound around a side wall surface of the pipe 38, a thermometer 40 protruding into the pipe 38, for measuring the temperature of the slurry 7, and a temperature adjuster 41 for controlling the heat-reserving condition of the heater 39 for reserving the heat of a slurry based on the temperature of the slurry 7 in the pipe 38. As the heater 39 for reserving the heat, a ribbon heater is used. In place of this, hot water may be allowed to flow through an outer tube of a double tube. Thus, the present invention is not limited as long as the heat of the slurry 7 in the pipe 38 can be reserved.

Next, the production of a wafer by cutting the workpiece 3 with a multi-wire saw of Embodiment 1 will be described.

As the workpiece 3, a polycrystalline silicon ingot (hereinafter, referred to as an ingot) is used. The outer shape thereof is a prism with a side of 150 mm and a length of 25 mm. The ingot is fixed onto a base plate 44 made of stainless steel via a dummy 10 made of glass with an adhesive made of epoxy resin or the like, and the base plate 44 is mechanically fixed to the stage 11.

Next, the wire is wound between the main roller 24 and the sub-roller 27 in a spiral shape. The wire 5 used herein is formed of a hard steel wire (piano wire), and its thickness is about 0.06 to 0.25 mm. Other wires may be formed of an alloy such as a nickel-chromium alloy or an iron-nickel alloy, metal with a high melting point such as tungsten or molybdenum, or bound polyamide fibers.

First, the wire 5 is unwound from the wire unwinding bobbin 22, has its traveling direction changed by being guided for traveling with the guide pulley 25, and is unwound to the frontmost groove of the main roller 24. Then, the wire 5 is unwound to the frontmost groove of the sub-roller 27 while being in contact with the frontmost groove of the main roller 24, and is turned around in the counter-clockwise direction halfway around the sub-roller 27 along the frontmost groove of the sub-roller 27. The wire 5 is unwound to the second frontmost groove from the front of the main roller 24, and is turned around in the counter-clockwise direction halfway around the main roller 24 along the second frontmost groove of the main roller 24. These operations are repeated, whereby a plurality of wires 5 stretched in a spiral shape at a desired pitch can be provided between the main roller 24 and the sub-roller 27.

Furthermore, the wire 5 unwound to the back groove of the main roller 24 from the sub-roller 27 is taken up around the wire take-up bobbin 23 while being guided with the guide pulley 26. The winding wire pitch of the main roller 24 and the sub-roller 27 is equal to the cutting pitch of an ingot, and the winding number is also determined arbitrarily in accordance with the number of wafers to be cut from an ingot.

Next, the slurry 7 used for cutting an ingot will be described. The slurry 7 contains an alkali or a mixed acid, and its component is composed of abrasive grains, a basic material, and a liquid component.

As the abrasive grains, those which are generally used as a polishing material may be used. Examples thereof include silicon carbide, cerium oxide, diamond, boron nitride, aluminum oxide, zirconium oxide, and silicon dioxide. Furthermore, they can be used alone or in combination of two or more kinds. Compounds that can be used for abrasive grains are commercially available. Specifically, examples of silicon carbide include GC (Trade Name) (Green Silicon Carbide) and C (Trade Name) (Black Silicon Carbide) (produced by Fujimi Inc.), and examples of aluminum oxide include FO (Trade Name) (Fujimi Optical Emery), A (Regular Fused Alumina), WA (White Fused Alumina), and PWA (Platelet Calcined Alumina) (produced by Fujimi Inc.).

The average grain diameter of the abrasive grains is not particularly limited, and it is preferably 1 μm to 60 μm, more preferably 5 μm to 20 μm. The content of the abrasive grains is not particularly limited, and it is preferably 20% by mass to 50% by mass with respect to the total mass of the slurry 7.

Furthermore, a material acting as a base in the slurry 7 may be used as the basic material. Examples thereof include alkali metal hydroxide such as lithium hydroxide, sodium hydroxide, and potassium hydroxide, and alkali earth hydroxide such as magnesium hydroxide, calcium hydroxide, and barium hydroxide. They can be used alone or in combination of two or more kinds. Among them, alkali metal hydroxide is preferable in terms of the reactivity with a silicon ingot.

The content of the basic material is in a range of 3.5% by mass to 20% by mass with respect to the total mass of the liquid component of the slurry 7.

Furthermore, as the liquid component of the slurry 7, water, a known coolant, and a mixture thereof can be used. The water used herein preferably contains less impurity. However, the present invention is not limited thereto. Specific examples of the water include pure water, ultrapure water, city water, and industrial water. The content of the water is not particularly limited, and is preferably 10% by mass to 75% by mass with respect to the entire mass of the slurry 7.

Furthermore, as the coolant, those which are generally used as a cutting assistant mixed solution containing polyethylene glycol, benzotriazole, oleic acid, and the like, such as a humectant, a lubricant, an anticorrosive, and a viscosity modifier, may be used. Such a coolant is commercially available, and specific examples thereof include Rikamultinole (Trade Name) (produced by Rikashokai Co., Ltd.) and Lunacoolant (produced by Daichikagaku). The content of the coolant is not particularly limited, and is preferably 0% by mass to 50% by mass with respect to the total mass of the slurry 7.

The slurry 7 with the above-mentioned configuration can be prepared by mixing the respective components in a desired ratio. The method of mixing the respective components is arbitrary, and for example, the components can be mixed by stirring with a wing-type stirrer. The order of mixing the respective components is also arbitrary. Furthermore, for the purpose of purification, the prepared slurry 7 may be subject to further processing (e.g., filtering and ion exchange processing).

The slurry 7 has a strong basicity. Therefore, the cutting interface of a silicon ingot weakens due to the reaction as represented by the following formula (1), and lapped with abrasive grains.

$$Si+4H_2O \rightarrow Si(OH)_4+2H_2 \quad (1)$$

The temperature of the slurry 7 for promoting the chemical reaction between the slurry 7 and the ingot is preferably in a range of 65° C. to 95° C. In the case where the temperature of the slurry 7 is too low, the reaction is not activated, so that the cutting resistance is not reduced sufficiently. The extremely high temperature of the slurry 7 is not preferable because water required for the reaction becomes insufficient due to the evaporation of the liquid component (mainly water) in the slurry, with the result that the cutting resistance increases.

The slurry 7 thus prepared is stored in the slurry storage tank 34, and heated to 65° C. to 95°. The slurry 7 with the temperature thus adjusted is discharged from the slurry discharge part 33 while the temperature of the slurry 7 is being kept at 65° C. to 95° C. in the thermal insulating pipe 32. The slurry 7 adheres to the wire 5 positioned below the slurry discharge part 33, and introduced to the cutting interface between the ingot and the wire 5. The ingot pressed down by the workpiece supporting mechanism 4 and the wire 5 with a slurry are brought into contact with each other, pressed, and slide, whereby an ingot is machined. Furthermore, the temperature of the air in the machining chamber 16 is controlled to be 65° C. to 95° C. Furthermore, the wire 5 is also heated to 65° C. to 95° C. At this time, in the case where an optimum temperature of the slurry 7, e.g., 80° C., the respective temperatures of the slurry 7, the wire 5, and the machining chamber 16 are controlled to be 80° C.

Furthermore, a remaining portion of the slurry 7 dropped from the ingot and the wire 5, discharged from the slurry discharge part 33, is collected by the slurry receiving plate 29, separated from an impurity (cuttings of silicon, etc.), and regenerated. Thereafter, the remaining portion is returned to the slurry storage tank 34 via a slurry collection drain tube 46.

As a specific example of a composition of the slurry 7, 4 parts by mass of sodium hydroxide were dissolved in 46 parts by mass of water to obtain a basic aqueous solution, and this aqueous solution and 50 parts by mass of a coolant (Lunacoolant #691, produced by Daichikagaku) were mixed. To this mixed solution, 100 parts by mass of SiC abrasive grains (GC#1200, average grain diameter: about 10 μm, produced by Fujimi Inc.) were added, followed by stirring, whereby a slurry 7 was prepared. The pH of the obtained slurry 7 at 25° C. was 13.9.

Next, using the obtained slurry 7, a polycrystalline silicon ingot (side: 150 mm, length: 25 mm) was cut under the following cutting conditions to produce a wafer.

The cutting conditions were a wire diameter of 0.1 mm, a cutting allowance of 0.13 mm, a cutting pitch of 0.39 mm, a cutting speed of 0.35 mm/min., a wire traveling speed of 600 m/min., and a slurry temperature of 80° C. As a comparative example, an ingot was cut similarly at a slurry temperature of 25° C.

At this time, as an index representing the magnitude of the cutting resistance, a warpage amount of the wire 5 was measured. Table 1 shows the results. During cutting machining, when the cutting resistance occurs at the cutting interface between the traveling wire 5 and the ingot, the wire 5 warps in an ingot sending direction. This warpage is proportional to the magnitude of the cutting resistance. Therefore, by measuring the warpage amount of the wire during cutting machining, the magnitude of the cutting resistance is known. In other words, a large warpage means that there is a delay in a cutting direction (z-direction) in the wire 5 at the cutting interface, which makes it impossible to obtain a desired cutting speed.

Next, the obtained wafer was washed with water and dried. Thereafter, the thickness irregularity of the wafer was evaluated. Furthermore, the presence/absence of saw marks on the surface of the wafer was visually evaluated. Table 1 shows the results.

TABLE 1

| Item | Example | Comparative Example |
| --- | --- | --- |
| Property of basic solution | Sodium hydroxide 4 parts by weight | Sodium hydroxide 1 part by weight |
| Water | 46 parts by weight | 49 parts by weight |
| Coolant | 50 parts by weight | |
| Abrasive grain | 100 parts by weight | |
| Slurry temperature | 80° C. | 25° C. |
| Wire warpage amount (cutting resistance) | 3.0 mm | 5.1 mm |
| Wafer thickness irregularity (average value) | 5 μm | 10 μm |
| Saw mark (visual) | Hardly observed | Observed in all places |

As is apparent from Table 1, by controlling the temperature of the slurry 7 to 80° C., high wafer quality with small thickness irregularity and no saw marks can be maintained, and the warpage amount of the wire, i.e., the cutting resistance can be reduced remarkably.

According to Embodiment 1, cutting machining can be performed while the temperatures of the slurry and the workpiece are maintained at desired values. Therefore, high wafer quality with small thickness irregularity and a very small amount of saw marks can be maintained, and the wire warpage amount, i.e., the cutting resistance can be reduced remarkably.

Embodiment 2

Figure 4:
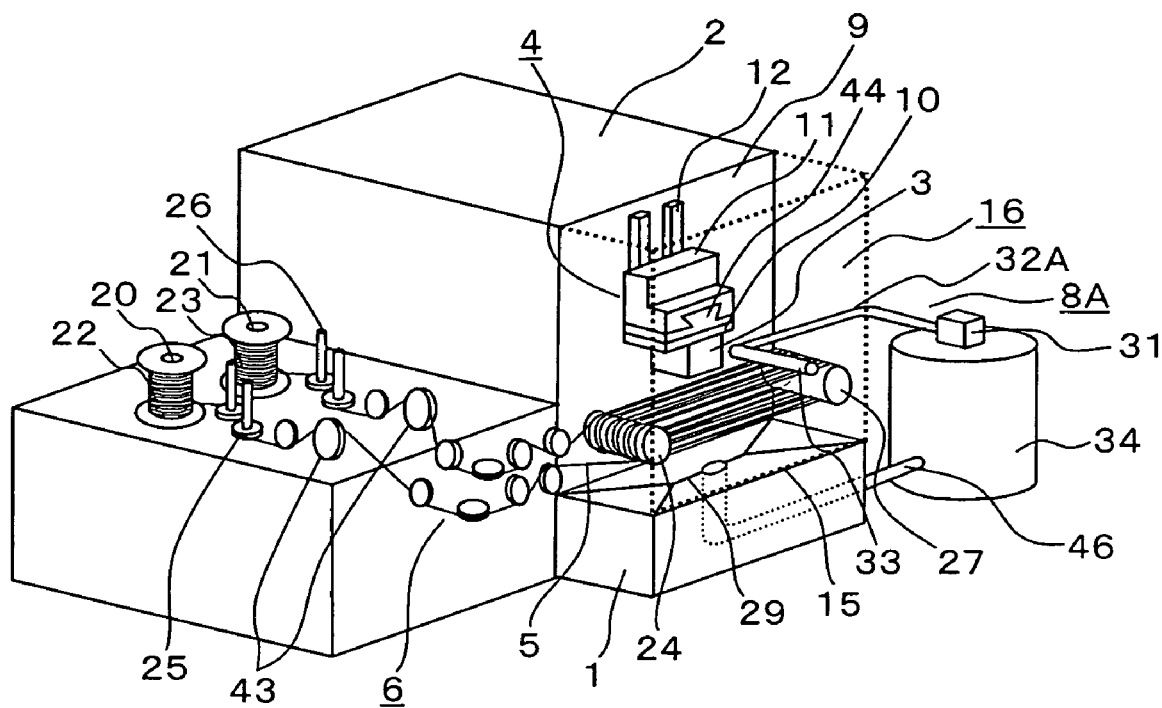
[FIG. 4] An external appearance view of a multi-wire saw according to Embodiment 3 of the present invention.

FIG. 4 is an external appearance view of a wire heating mechanism of a multi-wire saw according to Embodiment 2 of the present invention. The multi-wire saw of Embodiment 2 is the same as Embodiment 1 except for the wire heating mechanism, so that the description of the same parts will be omitted.

The wire heating mechanism includes two pulleys 25a, 25b that are away from each other so that the wire 5 with a desired length can travel, among a plurality of guide pulleys 25 for guiding the wire 5 between the wire unwinding bobbin 22 to the main roller 24, and a power source 42 for supplying a voltage between the two pulleys 25a, 25b. The pulleys 25a, 25b have conductivity, and a portion between the pulleys 25a, 25b, and the wire 5 can be brought into conduction. The wire unwinding bobbin 22 and the wire take-up bobbin 23 have insulation property so as to electrically float the wire 5.

The wire heating mechanism can heat the wire 5 by allowing a current to flow through the wire 5 between the pulleys 25a, 25b to generate Joule heat The wire 5 used in Embodiment 2 is a piano wire with a resistance R of 28.3 (Ω/m) and a diameter D of 0.1 (mm), and assuming that the wire feeding speed v is 10 (m/s) and the distance between pulleys L is 0.4 (m), a voltage required for increasing the temperature of the wire 5 by T=60(K) is obtained below.

A time t(sec) required for a minute portion Δx of the wire 5 to pass between the pulleys can be obtained from the following formula (2).

$$t=L/v=0.04 \text{ [sec]} \qquad (2)$$

Furthermore, a mass W(g) of the wire 5 present between the pulleys can be obtained from the following formula (3), assuming that a wire specific gravity A is 7.8 (g/cm$^2$).

$$W=(\Pi D^2/4)\cdot L\cdot A=0.025 \text{ [g]} \qquad (3)$$

A heat amount Q(J) required for raising the temperature can be obtained from the following formula (4), assuming that a wire specific heat C is 0.5 (J/gK).

$$Q=\Delta T\cdot C\cdot W=0.74 \text{ [J]} \qquad (4)$$

A current amount I(A) flowing through the wire 5 at this time can be obtained from the required heat amount Q from the following formula (5).

$$I=(Q/Rt)^{1/2}=1.3 \text{ [A]} \qquad (5)$$

A voltage V(V) between the pulleys that must be applied between the pulleys is as represented by the following formula (6).

$$V=IR=14\text{[V]} \qquad (6)$$

Thus, according to Embodiment 2, the wire can be heated easily with a commercially available general-purpose voltage source and battery. Furthermore, the heating temperature of the wire can be controlled easily by varying a power source voltage.

Embodiment 3

Figure 5:
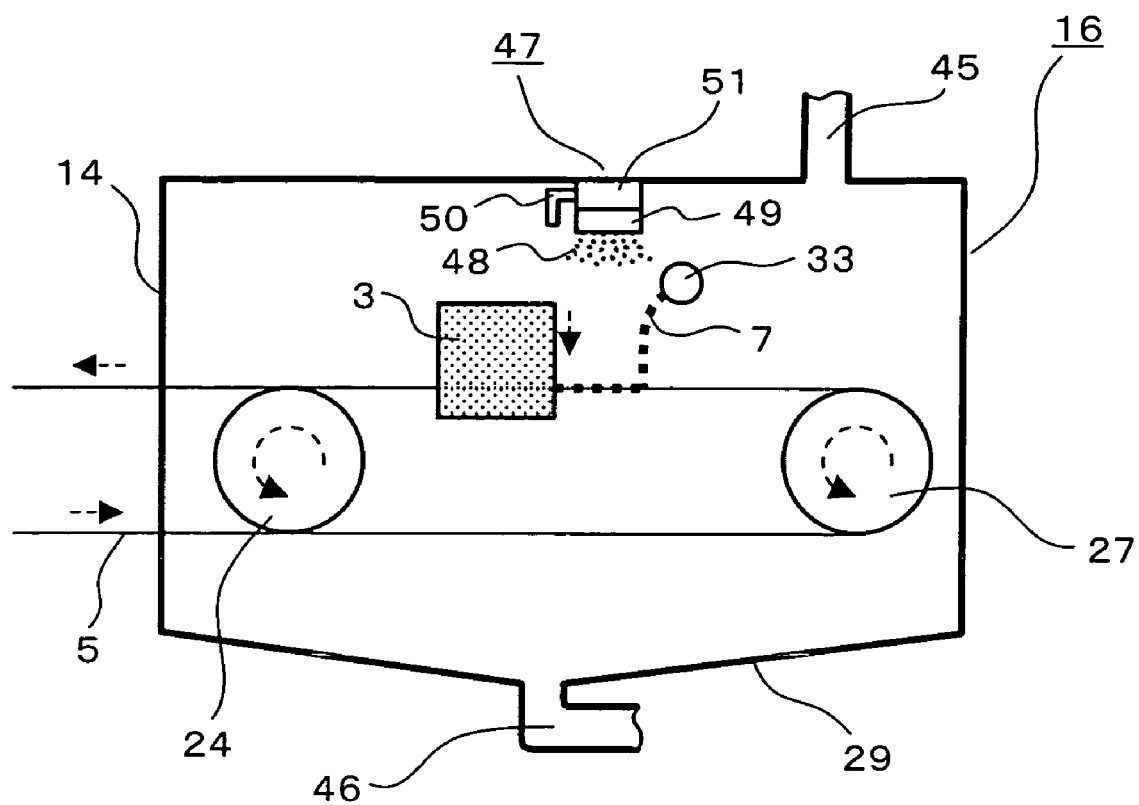
[FIG. 5] A partial external appearance view of the multi-wire saw according to Embodiment 3 of the present invention.
Figure 6:
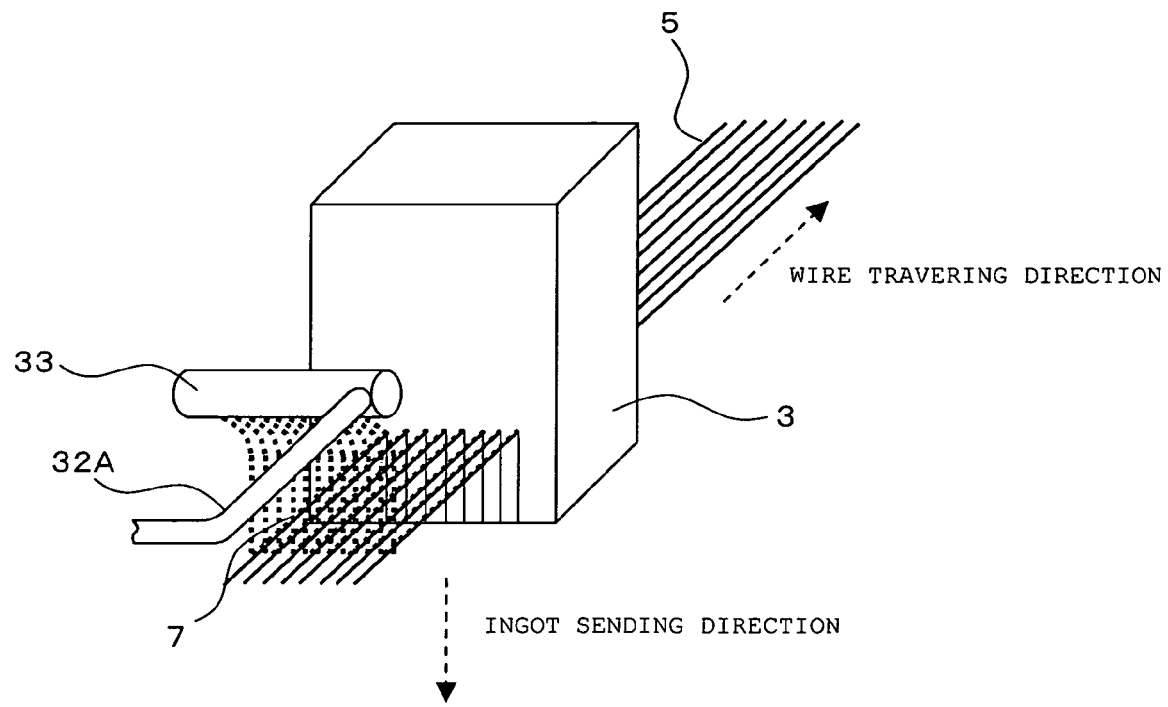
[FIG. 6] A view illustrating a cutting process of a workpiece with the multi-wire saw according to Embodiment 3 of the present invention.

FIG. 4 is an external appearance view of a multi-wire saw according to Embodiment 3 of the present invention. FIG. 5 is a partial external appearance view of the multi-wire saw of Embodiment 3. Furthermore, FIG. 6 is a view illustrating a cutting process of a workpiece with a multi-wire saw of Embodiment 3.

The multi-wire saw according to Embodiment 3 includes a base 1, a frame 2 provided upright on an upper surface of the base 1, a workpiece supporting mechanism 4, which supports a workpiece 3 so that it is movable in a machining direction, a wire supply mechanism 6 for supplying a wire 5 at a cutting portion of the workpiece 3 so that the wire 5 is incorporated into the substance 3, and a slurry supply mechanism 8A for supplying a slurry 7 at a cutting interface between the workpiece 3 and the wire 5. The base 1 is composed of a flat board supporting the multi-wire saw. The frame 2 is made of a box, and is provided with a side plate 9 opposed to an operator.

The workpiece supporting mechanism 4 includes a stage 11 for fixing the workpiece 3 via a dummy plate 10, a stage moving mechanism 12 supported movably with respect to the frame 2 and adapted to press down the stage 11 while applying a predetermined load to the stage 11 in the machining direction, and a machining chamber 16 surrounding the periphery of the stage 11. The machining chamber 16 is surrounded by the frame 2, four side walls 14 protruding forward from the frame 2, and a front wall 15 opposed to the frame 2 and connected to a front side of the side walls 14. As shown in FIG. 5, on a ceiling surface of the machining chamber 16, a discharge portion 45 for discharging atmosphere (containing gas generated during cutting machining, e.g., hydrogen) in the machining chamber 16 is provided, and a slurry collection drain tube 46 is connected to a slurry receiving plate 29 of the machining chamber 16. On a ceiling surface of the machining chamber 16, a humidity adjusting mechanism 47 for adjusting the humidity in the machining chamber 16 to be a set humidity is attached. The humidity adjusting mechanism 47 includes a humidifier 49 for generating water vapor 48, a hygrometer 50 for measuring humidity, and a control device 51 for operating/suspending the humidifier 49 based on the comparison results between the set humidity and the measured humidity in the machining chamber 16. Therefore, the humidity in the machining chamber 16 can be adjusted by the humidity adjusting mechanism 47. The humidifier 49 used herein is not particularly limited, as long as it can generate the water vapor 48. Examples of the humidifier 49 include an ultrasonic humidifier and a heater-type humidifier.

The wire supply mechanism 6 includes two motors (not shown) provided to the base 1, an unwinding rotation shaft 20 and a take-up rotation shaft 21 connected respectively to the shafts of the motors, a wire unwinding bobbin 22 which is fitted in the unwinding rotation shaft 20 and from which the wire 5 is unwound, a wire take-up bobbin 23 which is fitted in the take-up rotation shaft 21 and takes up the wire 5 returned from the machining chamber 16, a plurality of guide pulleys 25 for guiding the travel of wire 5 unwound from the wire unwinding bobbin 22 to a main roller 24 supported on the frame 2, a plurality of guide pulleys 26 for guiding the travel of the wire 5 returned from the main roller 24 to the wire take-up bobbin 23, and a tension control roller 43 for controlling the tension of the wire 5 guided with the guide pulleys 25, 26.

The wire supply mechanism 6 includes a main roller 24 which is rotatably supported so as to be vertical to the frame 2, and in which a plurality of grooves are formed at an equal interval on an outer circumferential surface, and a sub-roller 27 which is rotatably supported with respect to the frame 2 so as to be parallel to the main roller 24, and in which a plurality of grooves are formed at an equal interval on an outer circumferential surface.

The slurry supply mechanism 8A includes: a slurry storage tank 34 for storing the slurry 7 supplied to the wire 5, and the slurry 7 collected in the slurry receiving plate 29 in the machining chamber 16 and returned therefrom via the slurry collection drain tube 46; a pump 31 for sending the slurry 7 from the slurry storage tank 34; a pipe 32A for allowing the slurry 7 sent from the pump 31 to pass therethrough to be sent to the machining chamber 16; and a slurry discharge part 33 for discharging the slurry 7 sent via the pipe 32A toward the wire 5. The slurry discharge part 33 is placed above the position between the sub-roller 27 placed on a upstream side of a site where the workpiece 3 is cut and the site where the workpiece 3 is cut in the machining chamber 16. Although the slurry storage tank 34 may be placed in the machining chamber 16, it is desirably placed outside of the machining chamber 16 because the slurry storage amount is limited, and the structure of the machining chamber 16 becomes complicated when the slurry storage tank 34 is placed in the machining chamber 16.

Next, the production of a wafer by cutting the workpiece 3 with the multi-wire saw of Embodiment 3 will be described.

As the workpiece 3, a polycrystalline silicon ingot (hereinafter, referred to as an ingot) is used. The ingot is fixed onto a base plate 44 made of stainless steel via a dummy 10 made of glass with an adhesive made of epoxy resin or the like, and the base plate 44 is mechanically fixed to the stage 11.

Next, the wire 5 is wound between the main roller 24 and the sub-roller 27 in a spiral shape. The wire 5 used herein is formed of a hard steel wire (piano wire), and its thickness is about 0.06 to 0.25 mm. Other wires may be formed of an alloy such as a nickel-chromium alloy or an iron-nickel alloy, metal with a high melting point such as tungsten or molybdenum, or bound polyamide fibers.

First, the wire 5 is unwound from the wire unwinding bobbin 22, has its traveling direction changed by being guided for traveling with the guide pulley 25, and is unwound to the frontmost groove of the main roller 24. Then, the wire 5 is unwound to the frontmost groove of the sub-roller 27 while being in contact with the frontmost groove of the main roller 24, and is turned around in the counter-clockwise direction halfway around the sub-roller 27 along the frontmost groove of the sub-roller 27. The wire 5 is unwound to the second frontmost groove of the main roller 24, and turned around in the counter-clockwise direction halfway around the main roller 24 along the second frontmost groove of the main roller 24. These operations are repeated, whereby a plurality of wires 5 stretched in a spiral shape at a desired pitch can be provided between the main roller 24 and the sub-roller 27.

Furthermore, the wire 5 unwound to the back groove of the main roller 24 from the sub-roller 27 is taken up around the wire take-up bobbin 23 while being guided with the guide pulley 26. The winding wire pitch of the main roller 24 and the sub-roller 27 is equal to the cutting pitch of an ingot, and the winding number is also determined arbitrarily in accordance with the number of wafers to be cut from an ingot.

When the wire supply mechanism 6 is driven in such a multi-wire saw, the wire 5 travels in a fixed direction at a predetermined speed while a constant tension is being maintained by the tension control roller 43. At this time, the main roller 24 and the sub-roller 27 are rotated in synchronization at a rotation speed in accordance with the traveling speed of the wire 5. In the machining chamber 16, the wire 5 is guided along the grooves of the main roller 24 and the sub-roller 27. Therefore, the wire 5 is arranged at a constant tension while the lines of the wire 5 travel in parallel below the stage 11. Herein, when the workpiece supporting mechanism 4 presses down an ingot as the workpiece 3 toward the wire 5, the ingot comes into contact with the traveling wire 5 and is pressed against it. At this time, as shown in FIG. 6, when the slurry 7 is discharged from the slurry discharge part 33, and is supplied to the traveling wire 5, the slurry 7 is transported to the cutting interface with respect to the ingot by the traveling wire 5. Then, the bond of silicon atoms is broken by the lapping action and the chemical action of the slurry 7, whereby an ingot is cut.

During such a cutting machining process, as shown in FIG. 5, the water vapor 48 is released from the humidity adjusting mechanism 47 to the machining chamber 16, whereby the humidity (relative humidity) in the machining chamber 16 is kept in a state close to a saturated vapor pressure.

Figure 7:
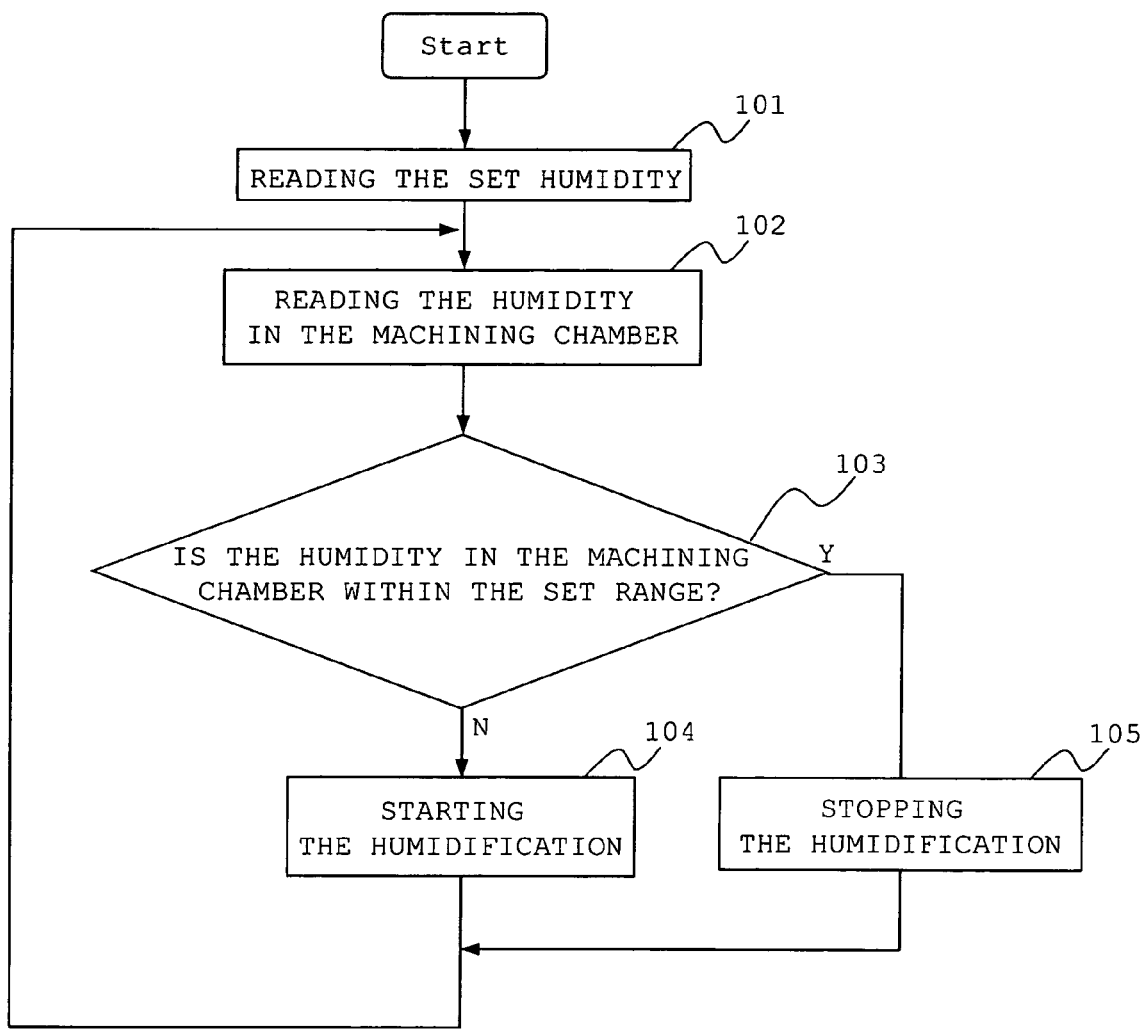
[FIG. 7] A flow chart of humidity adjustment according to Embodiment 3 of the present invention.

The humidity adjustment in the machining chamber 16 by the humidity adjusting mechanism 47 will be described with reference to FIG. 7. First, when it is confirmed that the multi-wire saw is being operated, the set humidity input to the control device 51 is read in Step 101, and the process proceeds to Step 102. In Step 102, the humidity in the machining chamber 16 measured by the hygrometer 50 is read, and the process proceeds to Step 103. In Step 103, the control device 51 determines whether or not the measured humidity in the machining chamber 16 is in the set range. In the case where the measured humidity in the machining chamber 16 is lower than the set range, the determination is denied, and the process proceeds to Step 104, whereby humidification is started by the humidifier 49. On the other hand, in Step 103, in the case where the measured humidity in the machining chamber 16 is higher than the set range, the determination is affirmed, and the process proceeds to Step 105, where humidification by the humidifier 49 is stopped.

Herein, it is desirable that the humidity in the machining chamber 16 be adjusted to be in a range of 95 to 99%. When the humidity is too low, the evaporation amount of water contained in the slurry 7 increases, and the viscosity of the slurry 7 increases, so that saw marks may be generated. When the humidity is too high, the water vapor 48 released to the machining chamber 16 becomes water droplets, which are collected in the slurry receiving plate 29, whereby the slurry 7 in the slurry storage tank 34 is diluted to decrease the viscosity. When the viscosity of the slurry 7 decreases, the amount of the slurry 7 that drops from the wire 5 increases, and the cutting efficiency may decrease.

Figure 8:
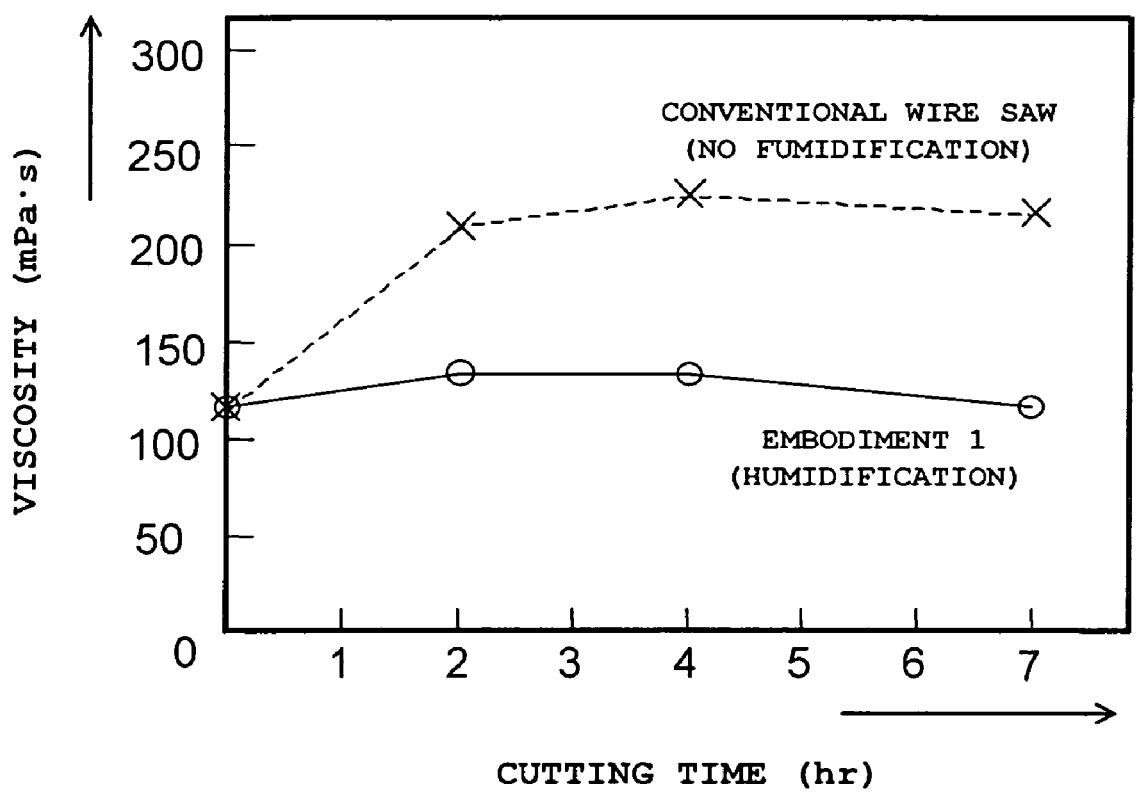
[FIG. 8] A graph showing the viscosity of a slurry in a slurry storage tank according to Embodiment 3 of the present invention.

In the multi-wire saw according to Embodiment 3, an experiment of cutting machining of a silicon ingot was performed, using a slurry containing 46 parts by mass of water, 4 parts by mass of sodium hydroxide, 50 parts by mass of propylene glycol, and 100 parts by mass of abrasive grains (titanium carbide with an average grain diameter of 10 μm) under the condition that the humidity in the machining chamber 16 was 98%, and the temperature therein was 80° C. The slurry in the slurry storage tank 34 was collected every predetermined time (0, 2, 4, and 7 hours), and the viscosity at a shear speed of 57.6 $[s^{-1}]$ and 25° C. was measured using a rotation viscometer (e.g., Programmable rheometer DV-III, produced by Brookfield). FIG. 8 shows the results.

As is apparent from FIG. 8, when cutting machining of an ingot is performed in the machining chamber 16 with the humidity maintained in a state close to saturated vapor pressure, the evaporation of water contained in the slurry 7 is suppressed. Therefore, the viscosity of the slurry 7 is held almost constant. In contrast, in a conventional multi-wire saw (humidity in the machining chamber: about 70%) in which humidification is not performed, the viscosity of the slurry 7 increased greatly within 2 hours from the commencement of cutting machining.

Furthermore, the following was confirmed. When a silicon ingot (side: 150 mm, length: 25 mm) was cut under the condition that the humidity in the machining chamber was 98%, the cutting speed was 0.35 mm/min., and the wire traveling speed was 600 m/min., using a slurry at 80° C. containing 4% by mass of sodium hydroxide and a piano wire with a diameter of 0.1 mm in the multi-wire saw according to Embodiment 3, the silicon ingot was cut without the breakage of the wire. In contrast, when a silicon ingot was cut using a conventional multi-wire saw, a wire broke within about one hour (cutting length: about 21 mm) from the commencement of cutting machining.

As described above, according to Embodiment 3, the humidity in the machining chamber 16 is maintained in a state close to a saturated vapor pressure, so that the change in viscosity of the slurry 7 is very small, and the slurry 7 is not dried or solidified in an inlet portion through which the wire 5 is inserted to a silicon ingot as the workpiece 3. Therefore, the breakage of the wire can be prevented while high machining quality is maintained. Furthermore, a mechanism for adjusting the viscosity while supplying water to the slurry storage tank 34 as in the conventional multi-wire saw is not required, which makes it easy to manage the viscosity of the slurry.

In the multi-wire saw according to Embodiment 3, although the slurry discharge part 33 is placed above a position between the sub-roller 27 placed on an upstream side of a site where the workpiece 3 is cut and the site where the workpiece 3 is cut, the present invention is not limited thereto. For example, the slurry discharge part 33 may be placed so as to be close to an upstream side wall surface of a site where the workpiece 3 is cut so that the slurry 7 discharged from the slurry discharge part 33 moves along a side surface of the workpiece 3 and supplied to the wire 5.

Furthermore, in the multi-wire saw according to Embodiment 3, the humidity adjusting mechanism 47 is placed in the machining chamber 16. However, the present invention is not limited thereto as long as the water vapor 48 can be released from the humidity adjusting mechanism 47 to the machining chamber 16. For example, the humidity adjusting mechanism 47 may be placed outside of the machining chamber 16 so that the water vapor 48 is released from the humidity adjusting mechanism 47 to the machining chamber 16 via a piping or the like.

Furthermore, in the machining chamber 16 according to Embodiment 3, a forced convection type fan may be provided so that the humidity in the machining chamber 16 becomes uniform.

Furthermore, in order to adjust the temperature of the slurry 7, a heater for heating a slurry that surrounds the periphery of the slurry storage tank 34 and heats it may be provided. As such a heater for heating a slurry, there is no particular limit as long as it can heat the slurry 7. Examples of the heater for heating a slurry include a heating wire, a throw-in heater, a ribbon heater, and a hot water heater.

Embodiment 4

Figure 9:
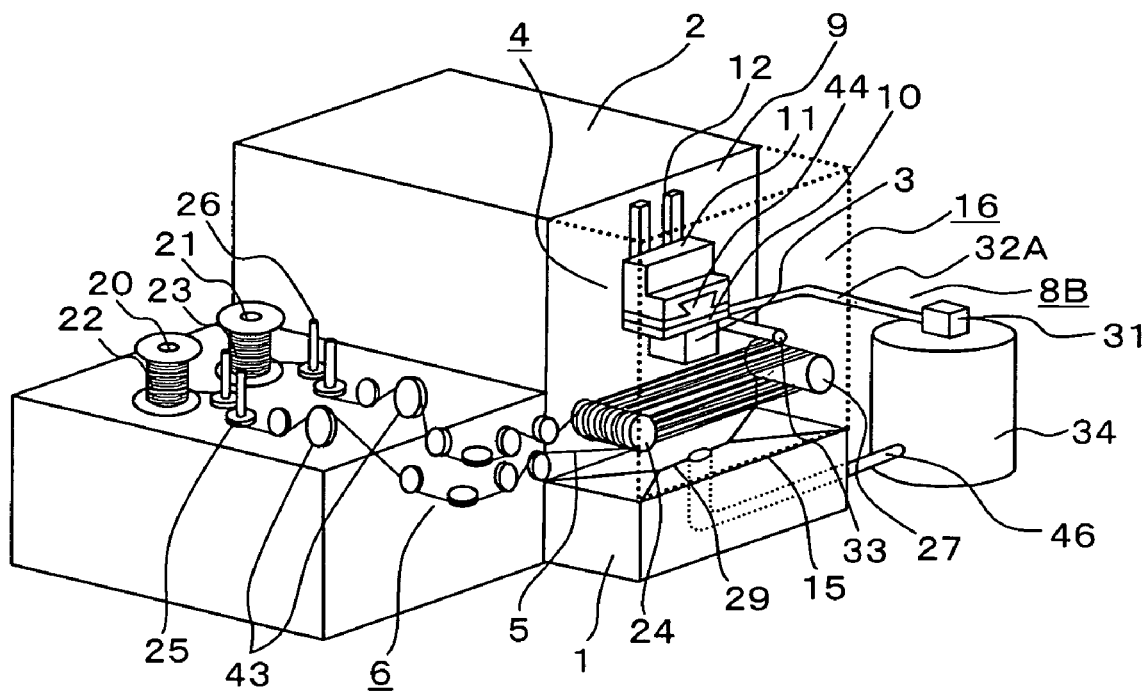
[FIG. 9] An external view of a multi-wire saw according to Embodiment 4 of the present invention.
Figure 10:
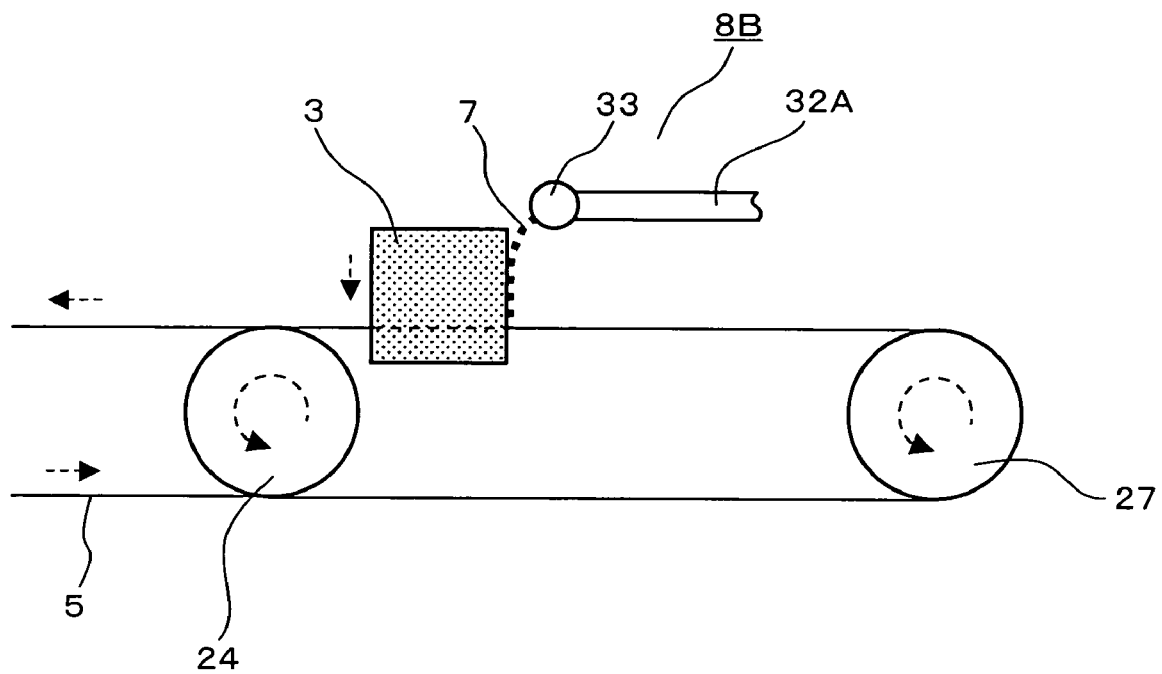
[FIG. 10] A partial external view of the multi-wire saw according to Embodiment 4 of the present invention.
Figure 11:
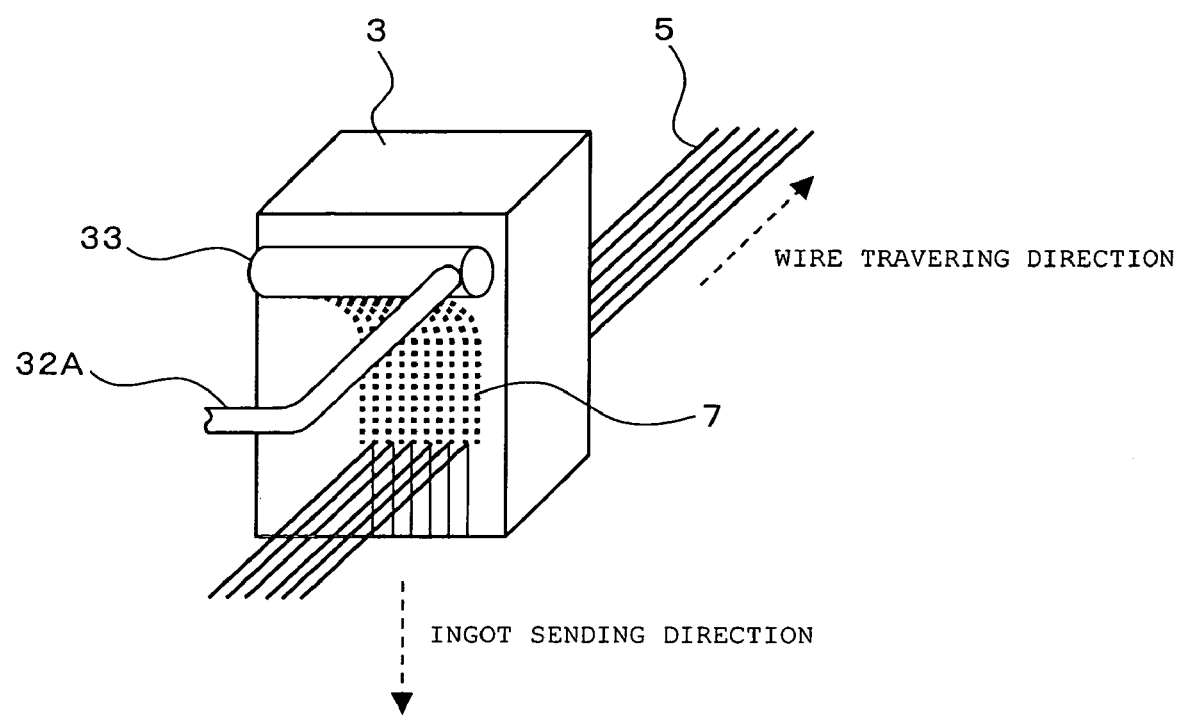
[FIG. 11] A view illustrating a cutting process of a workpiece with the multi-wire saw according to Embodiment 4 of the present invention.

FIG. 9 is an external appearance view of a multi-wire saw according to Embodiment 4 of the present invention. FIG. 10 is a partial external appearance view of the multi-wire saw of Embodiment 4. Furthermore, FIG. 11 illustrates a cutting process of a workpiece by the multi-wire saw of Embodiment 4.

The multi-wire saw according to Embodiment 4 includes a base 1, a frame 2 provided upright on an upper surface of the base 1, a workpiece supporting mechanism 4, which supports a workpiece 3 so as to be movable in a machining direction, a wire supply mechanism 6 for supplying a wire 5 to a cutting portion of the workpiece 3 so that the wire 5 is incorporated into the substance 3, and a slurry supply mechanism 8B for supplying a slurry 7 to a cutting interface between the workpiece 3 and the wire 5. The base 1 is composed of a flat board supporting the multi-wire saw. The frame 2 is made of a box, and is provided with a side plate 9 opposed to an operator.

The workpiece supporting mechanism 4 includes a stage 11 for fixing the workpiece 3 via a dummy plate 10, a stage moving mechanism 12 supported movably with respect to the frame 2 and adapted to press down the stage 11 in the machining direction, and a machining chamber 16 surrounding the periphery of the stage 11. The machining chamber 16 is surrounded by the frame 2, four side walls 14 protruding forward from the frame 2, and a front wall 15 opposed to the frame 2 and connected to a front side of the side walls 14.

The wire supply mechanism 6 includes two motors (not shown) provided to the base 1, an unwinding rotation shaft 20 and a take-up rotation shaft 21 connected respectively to the shafts of the motors, a wire unwinding bobbin 22 which is fitted in the unwinding rotation shaft 20 and from which the wire 5 is unwound, a wire take-up bobbin 23 which is fitted in the take-up rotation shaft 21 and takes up the wire 5 returned from the machining chamber 16, a plurality of guide pulleys 25 for guiding the travel of wire 5 unwound from the wire unwinding bobbin 22 to a main roller 24 supported on the frame 2, a plurality of guide pulleys 26 for guiding the travel of the wire 5 from the main roller 24 to the wire take-up bobbin 23, and a tension control roller 43 for controlling the tension of the wire 5 guided with the guide pulleys 25, 26.

Furthermore, the wire supply mechanism 6 includes the main roller 24 which is rotatably supported so as to be vertical to the frame 2, and in which a plurality of grooves are formed at an equal interval on an outer circumferential surface, and a sub-roller 27 which is rotatably supported with respect to the frame 2 so as to be parallel to the main roller 24, and in which a plurality of grooves are formed at an equal interval on an outer circumferential surface.

Next, the supply of the slurry 7 to the wire 5 by the slurry supply mechanism 8B will be described specifically with reference to FIG. 10.

The slurry supply mechanism 8B includes a slurry storage tank 34 for storing a slurry 7 supplied to the wire 5 and a slurry 7 collected by a slurry receiving plate 29 in the machining chamber 16 and returned via the slurry collection drain tube 46, a pump 31 for sending the slurry 7 from the slurry storage tank 34, a pipe 32A through which the slurry 7 sent from the pump 31 is sent to the machining chamber 16, and a slurry discharge part 33 for discharging the slurry 7 sent via the pipe 32A to the wire 5. As shown in FIG. 10, the slurry discharge part 33 is provided above a position between the sub-roller 27 provided on an upstream side of a site where the workpiece 3 is cut and the site where the workpiece 3 is cut so that the discharged slurry 7 moves along a side surface of the workpiece 3 (the slurry 7 is positioned close to an upstream side wall surface of the site where the workpiece 3 is cut). When the slurry 7 is supplied from the slurry discharge part 33 to the wire 5, the slurry 7 is discharged, for example, in a curtain shape, from the slurry discharge part 33. At this time, the slurry discharge part 33 is placed above the site where the workpiece 3 is cut, so that the discharge slurry 7 flows down along the side surface of the workpiece 3. When the slurry 7 moves to a crossing point between the wire 5 and the workpiece 3 without undergoing evaporation of water to come into contact with the wire 5, the slurry 7 is transported to the cutting interface of the workpiece 3 by the wire 5. During such cutting machining, the slurry 7 always flows on the side surface of the workpiece 3, in particular, at a crossing point between the running wire 5 and the workpiece 3, so that the viscosity of the slurry 7 always becomes constant.

Next, the production of a wafer by cutting the workpiece 3 using the multi-wire saw of Embodiment 4 will be described.

As the workpiece 3, a polycrystalline silicon ingot (hereinafter, referred to as an ingot) is used. The ingot is fixed onto a base plate 44 made of stainless steel via a dummy 10 made of glass with an adhesive made of epoxy resin or the like, and the base plate 44 is mechanically fixed to the stage 11.

Next, the wire 5 is wound between the main roller 24 and the sub-roller 27 in a spiral shape. The wire 5 used herein is formed of a hard steel wire (piano wire), and its thickness is about 0.06 to 0.25 mm. Other wires may be formed of an alloy such as a nickel-chromium alloy or an iron-nickel alloy, metal with a high melting point such as tungsten or molybdenum, or bound polyamide fibers.

First, the wire 5 is unwound from the wire unwinding bobbin 22, has its traveling direction changed by being guided for traveling with the guide pulley 25, and is unwound to the frontmost groove of the main roller 24. Then, the wire 5 is unwound to the frontmost groove of the sub-roller 27 while being in contact with the frontmost groove of the main roller 24, and is turned around in the counter-clockwise direction halfway around the sub-roller 27 along the frontmost groove of the sub-roller 27. The wire 5 is unwound to the second frontmost groove of the main roller 24, and turned around in the counter-clockwise direction halfway around the main roller 24 along the second frontmost groove of the main roller 24. These operations are repeated, whereby a plurality of wires 5 stretched in a spiral shape at a desired pitch can be provided between the main roller 24 and the sub-roller 27.

Furthermore, the wire 5 unwound to the rearmost groove of the main roller 24 from the sub-roller 27 is taken up around the wire take-up bobbin 23 while being guided with the guide pulley 26. The winding wire pitch of the main roller 24 and the sub-roller 27 is equal to the cutting pitch of an ingot, and the winding number is also determined arbitrarily in accordance with the number of wafers to be cut from an ingot.

When the wire supply mechanism 6 is driven in such a multi-wire saw, the wire 5 travels in a fixed direction at a predetermined speed while a constant tension is being maintained by the tension control roller 43. At this time, the main roller 24 and the sub-roller 27 are rotated in synchronization with each other at a rotation speed in accordance with the traveling speed of the wire 5. In the machining chamber 16, the wire 5 is guided along the grooves of the main roller 24 and the sub-roller 27. Therefore, the wire 5 is arranged under a constant tension while the lines of the wire 5 travel in parallel below the stage 11. Herein, when the workpiece supporting mechanism 4 presses down an ingot as the workpiece 3 toward the wire 5, the ingot comes into contact with the traveling wire 5 and is pressed against it. At this time, as shown in FIG. 11, when the slurry 7 is discharged from the slurry discharge part 33 and moves along a side surface of an ingot and is supplied to the traveling wire 5, the slurry 7 is transported to the cutting interface with respect to the ingot by the traveling wire 5. Then, the bond of silicon atoms is broken by the lapping action and the chemical action of the slurry 7, whereby an ingot is cut.

Furthermore, a remaining portion of the slurry 7 discharged from the slurry discharge part 33 and dropped from the ingot and the wire 5, is collected by the slurry receiving plate 29, separated from an impurity (cuttings of silicon, etc.), and regenerated. Thereafter, the remaining portion is returned to the slurry storage tank 34 via a slurry collection drain tube 46.

A silicon ingot (side: 150 mm, length: 25 mm) was cut under the condition that the cutting speed was 0.35 mm/min., and the wire traveling speed was 600 m/min., using a slurry at 80° C. containing 4% by mass of sodium hydroxide and a piano wire with a diameter of 0.1 mm in the multi-wire saw according to Embodiment 4 (the wire was not broken). After cutting, the inlet portion through which the wire is inserted to the silicon ingot was observed. As a result, the adhesion of a solidified slurry was not recognized. When a silicon ingot was cut using a conventional multi-wire saw, and a wire was broken about one hour (cutting length: about 21 mm) after the commencement of cutting machining, a large amount of solidified slurry adhered to the inlet portion.

As described above, according to Embodiment 4, the slurry 7 always flows at a crossing point between the running wire 5 and an ingot as the workpiece 3, so that the slurry 7 is not dried or solidified. Therefore, the resistance applied upon the running of the wire 5 can be reduced, and the breakage of the wire that markedly decreases the productivity can be prevented.

Embodiment 5

Figure 12:
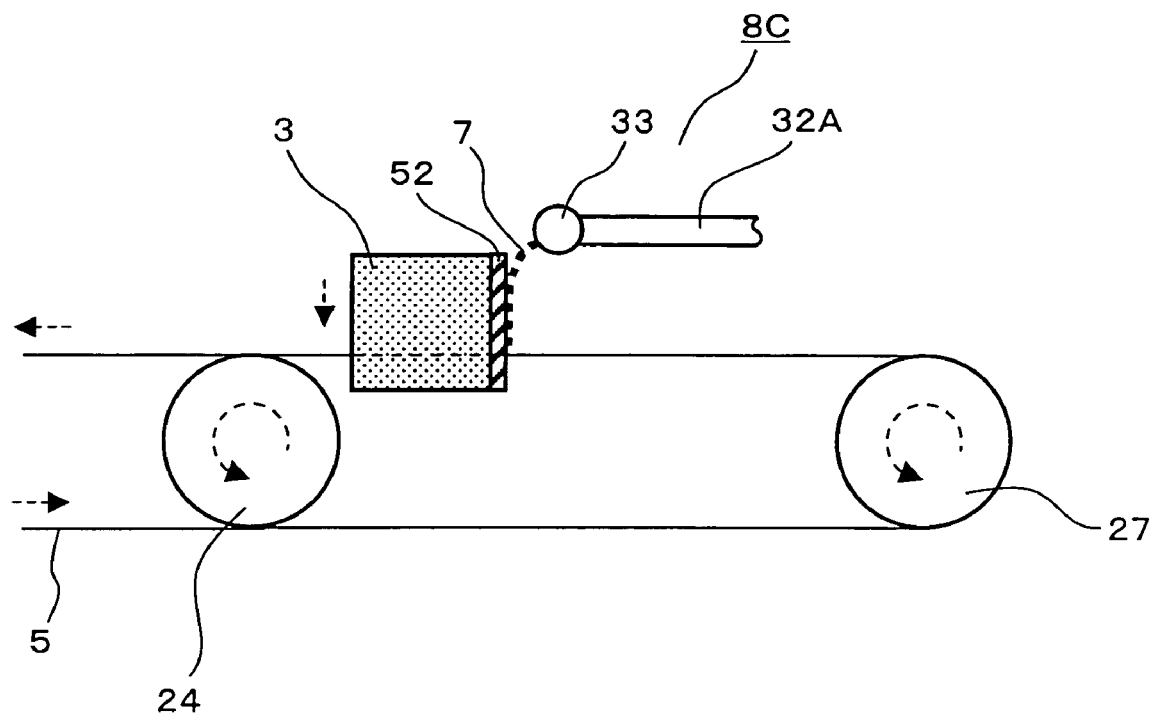
[FIG. 12] A partial external view of a multi-wire saw according to Embodiment 5 of the present invention.

FIG. 12 is a partial external appearance view of a multi-wire saw of Embodiment 5.

In the multi-wire saw according to Embodiment 5, the slurry supply mechanism 8C includes a sheet component 52 attached to a side surface of the workpiece 3. Otherwise, Embodiment 5 is configured in the same way as in Embodiment 4.

The sheet component 52 used herein may be made of a material that does not react with the slurry 7 or has a very low reactivity with respect to the slurry 7. Examples of a material for the slurry 7 containing a strong alkaline substance such as sodium hydroxide include polyethylene, polypropylene, methylpentene resin, fluorine resin, natural rubber, styrene rubber, butyl rubber, and ethylene-propylene rubber. Furthermore, the sheet component 52 preferably has a hardness smaller than that of the workpiece 3 from the viewpoint of the cutting efficiency. Furthermore, the temperature of the cutting site of the workpiece 3 often increases to a high temperature of about 100° C. due to the resistance applied during traveling of the wire 5. Therefore, when the sheet component 52 made of the above-mentioned material is attached, it is preferable to use a thermoplastic adhesive with a glass transition temperature of 100° C. or higher.

In the slurry supply mechanism 8C, the sheet component 52 is attached to a side surface of the workpiece 3. Therefore, the slurry 7 discharged from the slurry discharge part 33 flows down along the surface of the sheet component 52. Consequently, even when the slurry 7 having a chemical reactivity with respect to the workpiece 3 continues to be discharged to the side surface of the workpiece 3, the surface of the workpiece 3 is not etched.

Thus, according to Embodiment 5, even when the slurry 7 having a chemical reactivity with respect to the workpiece continues to be discharged to the side surface of the workpiece 3, the side surface of the workpiece 3 is not etched, and the change in size of the workpiece 3 can be minimized.

In the multi-wire saw according to Embodiments 4 and 5, the slurry discharge part 33 is placed above a position between the sub-roller 27 and the site where the workpiece 3 is cut. However, the slurry discharge part 33 may not be placed above such a position, as long as the discharged slurry 7 can move along the side surface of the workpiece 3 and come into contact with the wire 5. For example, the slurry discharge part 33 may be placed by the side of or below a position between the sub-roller 27 and the site where the workpiece 3 is cut, so that the slurry 7 is discharged to the side surface of the workpiece 3.

Furthermore, in the slurry storage tank 34 according to Embodiments 4 and 5, a water control mechanism for keeping the water amount in the slurry 7 constant, a temperature control mechanism for keeping the temperature of the slurry 7 constant, a stirring mechanism for preventing the precipitation and aggregation of a slurry, and the like may be provided so that the composition of the slurry 7 discharged from the slurry discharge part 33 becomes constant. In particular, in the case of using the slurry 7 at a high temperature of about 65° C. to 95° C., the composition changes due to the evaporation of water, so that it is desirable to provide a water control mechanism. In this case, when the evaporation amount of water per unit time is previously determined, water only need to be supplied to the slurry storage tank 34 at a constant ratio, so that the water amount in the slurry 7 can be adjusted more easily.

In Embodiments 4 and 5, the configuration for moving the slurry 7 along the side surface of the workpiece 3 to the slurry 7 and the configuration for directly coating the wire 5 with the slurry 7 to supply the slurry 7 may be combined to introduce the slurry 7 to the cutting interface of the workpiece 3. In this case, the slurry 7 supplied by being directly applied to the wire 5 is mainly used for cutting the workpiece 3, and the slurry 7 moving along the side surface of the workpiece 3 is used as auxiliary means for preventing the solidification of the slurry 7 in the inlet portion through which the wire 5 is inserted into the workpiece 3. Therefore, it is preferable that the flow rate of the slurry 7 moving along the side surface of the workpiece 3 be set to the minimum.

Embodiment 6

Figure 13:
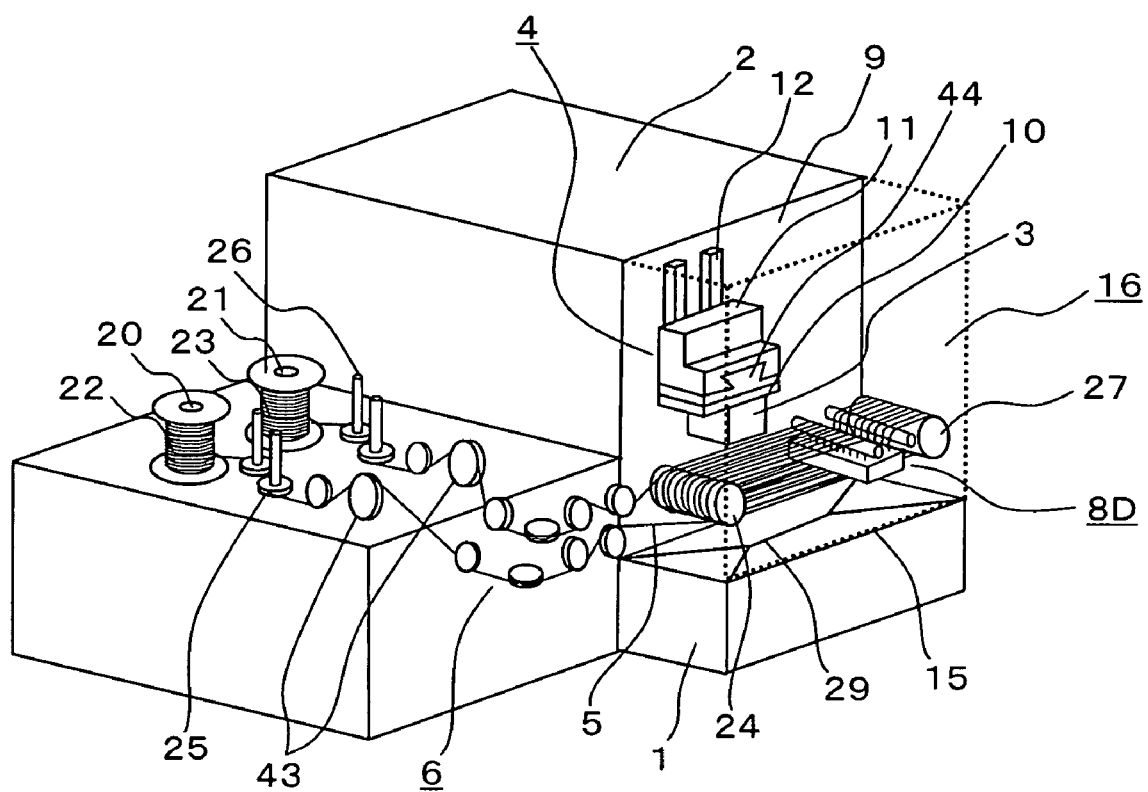
[FIG. 13] An external view of a multi-wire saw according to Embodiment 6 of the present invention.
Figure 14:
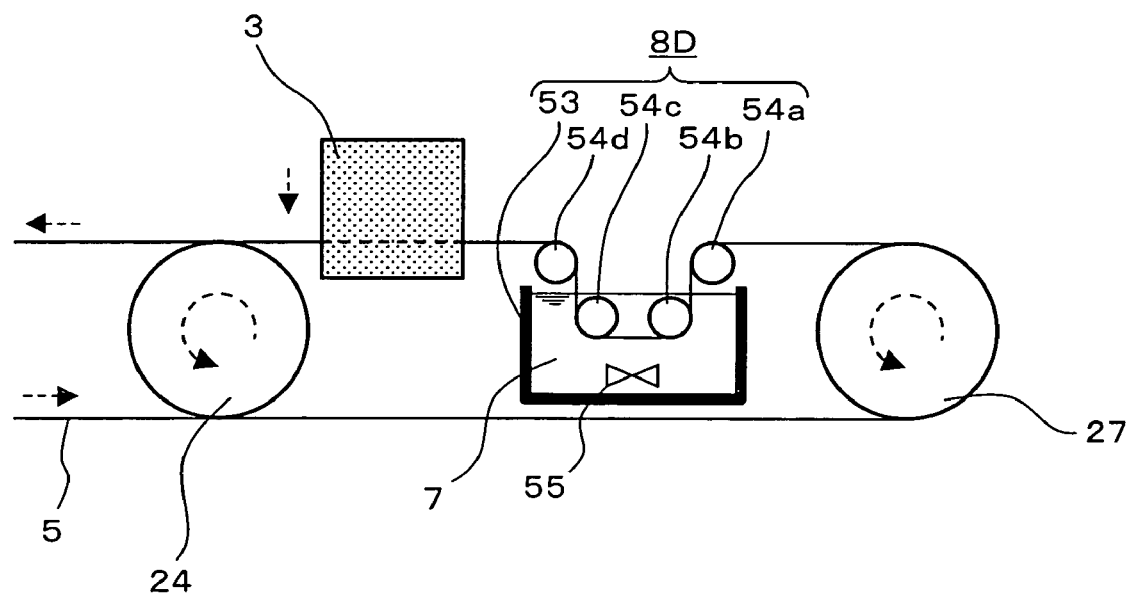
[FIG. 14] A partial external view of the multi-wire saw according to Embodiment 6 of the present invention.
Figure 15:
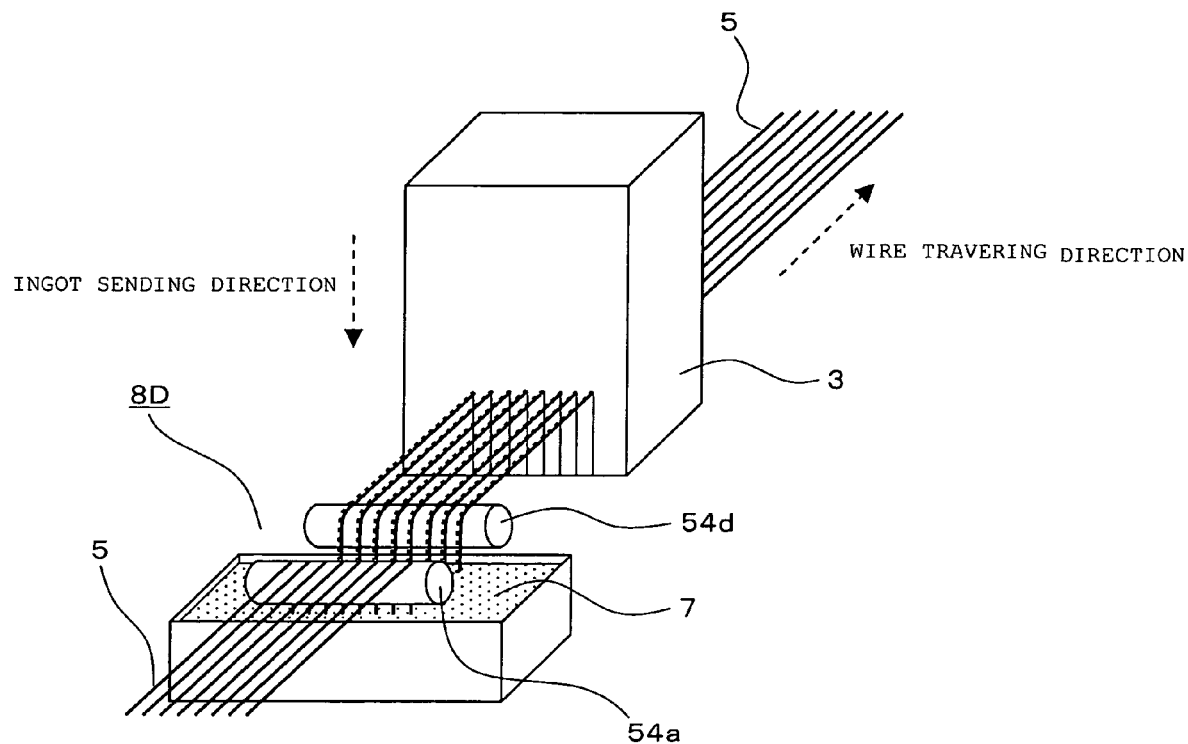
[FIG. 15] A view illustrating a cutting process of a workpiece with the multi-wire saw according to Embodiment 6 of the present invention.

FIG. 13 is an external appearance view of a multi-wire saw according to Embodiment 6 of the present invention. FIG. 14 is a partial external appearance view of the multi-wire saw of Embodiment 6. Furthermore, FIG. 15 illustrates a cutting process of a workpiece with the multi-wire saw of Embodiment 6.

The multi-wire saw according to Embodiment 6 includes a base 1, a frame 2 provided upright on an upper surface of the base 1, a workpiece supporting mechanism 4, which supports a workpiece 3 so as to be movable in the machining direction, a wire supply mechanism 6 for supplying a wire 5 to a cutting portion of the workpiece 3 so that the wire 5 is incorporated into the substance 3, and a slurry supply mechanism 8 for supplying a slurry 7 to a cutting interface between the workpiece 3 and the wire 5. The base 1 is composed of a flat board supporting the multi-wire saw. The frame 2 is made of a box, and is provided with a side plate 9 opposed to an operator.

The workpiece supporting mechanism 4 includes a stage 11 for fixing the workpiece 3 via a dummy plate 10, a stage moving mechanism 12 supported movably with respect to the frame 2 and adapted to press down the stage 11 while applying a predetermined load to the stage 11 in the machining direction, and a machining chamber 16 surrounding the periphery of the stage 11. The machining chamber 16 is surrounded by the frame 2, four side walls 14 protruding forward from the frame 2, and a front wall 15 opposed to the frame 2 and connected to a front side of the side walls 14.

The wire supply mechanism 6 includes two motors (not shown) provided to the base 1, an unwinding rotation shaft 20 and a take-up rotation shaft 21 connected respectively to the shafts of the motors, a wire unwinding bobbin 22 which is fitted in the unwinding rotation shaft 20 and from which the wire 5 is unwound, a wire take-up bobbin 23 which is fitted in the take-up rotation shaft 21 and takes up the wire 5 returned from the machining chamber 16, a plurality of guide pulleys 25 for guiding the travel of wire 5 unwound from the wire unwinding bobbin 22 to a main roller 24 supported on the frame 2, a plurality of guide pulleys 26 for guiding the travel of the wire 5 from the main roller 24 to the wire take-up bobbin 23, and a tension control roller 43 for controlling the tension of the wire 5 guided with the guide pulleys 25, 26.

Furthermore, the wire supply mechanism 6 includes the main roller 24 which is rotatably supported so as to be vertical to the frame 2, and in which a plurality of grooves are formed at an equal interval on an outer circumferential surface, and a sub-roller 27 which is rotatably supported with respect to the frame 2 so as to be parallel to the main roller 24, and in which a plurality of grooves are formed at an equal interval on an outer circumferential surface.

Next, the supply of the slurry 7 to the wire 5 by the slurry supply mechanism 8D will be described specifically with reference to FIGS. 14 and 15.

The slurry supply mechanism 8D includes a liquid tank 53 as an storing portion for storing the slurry 7, and a plurality of wire guiding rollers 54a, 54b, 54c, and 54d for introducing the wire 5 into the liquid tank 53 and pulling up the wire 5 from the liquid tank 53 to guide it to the workpiece 3. Furthermore, the liquid tank 53 is placed at a position between the sub-roller 27 positioned on an upstream side of a cutting portion of the workpiece 3 and the cutting portion of the workpiece 3, and has a stirring mechanism 55 for stirring the slurry 7 on a bottom portion.

Next, the production of a wafer by cutting the workpiece 3 with a multi-wire saw of Embodiment 6 will be described.

As the workpiece 3, a polycrystalline silicon ingot (hereinafter, referred to as an ingot) is used. The ingot is fixed onto a base plate 44 made of stainless steel via a dummy 10 made of glass with an adhesive made of epoxy resin or the like, and the base plate 44 is mechanically fixed to the stage 11.

When the wire supply mechanism 6 is driven, the wire 5 travels in a fixed direction at a predetermined speed while a constant tension is being maintained by the tension control roller 43. At this time, the main roller 24 and the sub-roller 27 are rotated in synchronization with each other at a rotation speed in accordance with the traveling speed of the wire 5. In the machining chamber 16, the wire 5 traveling between the main roller 24 and the sub-roller 27 enters the liquid tank 53 via the wire guiding roller 54a, is successively guided by the wire guiding rollers 54b, 54c, and sent out of the liquid tank 53. Since the slurry 7 is held in the liquid tank 53, the slurry 7 is supplied to the wire 5 as the wire 5 is guided in the liquid tank 53. Then, the slurry 7 adhering to the wire 5 is transported to the cutting interface of an ingot by the travel of the wire 5. Then, the bond of silicon atoms is broken by the lapping action and the chemical action of the slurry 7, whereby an ingot is cut.

Although not shown, a slurry storage/stirring tank for collecting the amount of the slurry 7 introduced to the cutting interface of the ingot, and a mechanism for supplying the amount of the slurry 7 introduced to the cutting interface of the ingot from the slurry storage/stirring tank to the liquid tank 53 are provided.

In the multi-wire saw according to Embodiment 6, the following was confirmed. In the case where 64 piano wires with a diameter of 0.1 mm (pitch: 0.39 mm, width: 25 mm) are allowed to enter and sent to the liquid tank 53 holding a slurry with a viscosity of 150 mPa·s (25° C., shear speed: 57.6 $[s^{-1}]$) via the wire guiding rollers 54a, 54b, 54c, and 54d at a speed of 10 m/second, a slurry sufficient for generating a lateral film (slurry film stretched between adjacent wires due to the surface tension) is applied uniformly to the wire, and cutting machining can be performed as usual.

Thus, according to Embodiment 6, the wire 5 is designed so as to pass through the liquid tank 53 placed on an upstream side of the cutting portion of the workpiece 3. Therefore, an appropriate amount of the slurry 7 adheres to the wire 5 sent from the liquid tank 53, which can cut the waste of the slurry, enhance the utilization efficiency of the slurry, and suppress an increase in the production cost. Furthermore, a slurry supply mechanism with a large flow rate and a large power for supplying/circulating a large amount of the slurry 7 is not required, resulting in an inexpensive apparatus. Furthermore, since the wire 5, to which an appropriate amount of the slurry 7 adheres, travels in the machining chamber 16, so that the scattering of the slurry 7 can also be minimized. This means saving of the labor for collecting the slurry 7 adhering to the wall surface and floor surface of the machining chamber 16, as well as less contamination of the machining chamber 16. Furthermore, the liquid tank 53 of Embodiment 6 may have a capacity smaller than that of the conventional one, so that the temperature of the slurry 7 can be managed easily, and the amount of the circulating slurry can be minimized. Therefore, the composition of the slurry in the slurry storage/stirring tank is stabilized, and the uniform dispersibility of abrasive grains can be maintained. Therefore, the composition of the slurry is managed precisely, and the slurry 7 in a state close to that adjusted initially can be continued to be supplied to the cutting interface of the workpiece 3, which suppresses the variation in wafer thickness, the generation of saw marks (scars), and the like, and improves the machining quality. Furthermore, the amount of the slurry 7 adhering to the opposed portion of the wire 5 wound in a spiral shape decreases, so that the slurry 7 does not adhere in an excess amount to the sub-roller 27 on a side close to the liquid tank 53, which can suppress the shortening of the life due to the abrasion of a roller groove.

Furthermore, in the liquid tank 53, a temperature control mechanism (not shown) for keeping the temperature constant as required, a filter (not shown) for removing cuttings of the workpiece 3, and the like may be provided. The liquid tank 53 is preferably placed close to the cutting portion of the workpiece 3.

Embodiment 7

Figure 16:
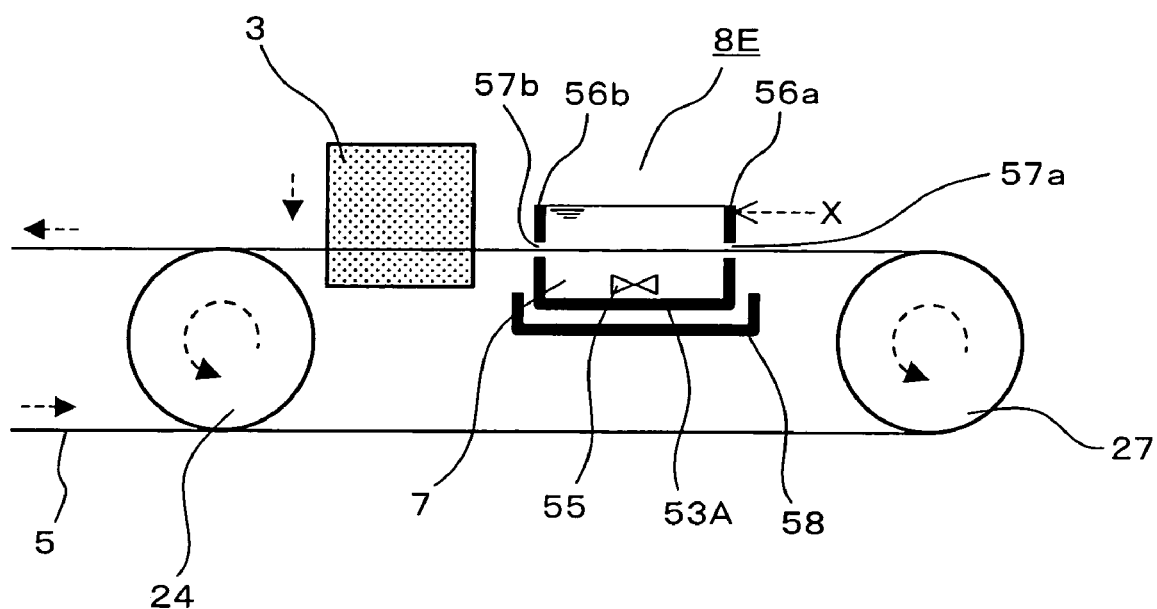
[FIG. 16] A partial external view of a multi-wire saw according to Embodiment 7 of the present invention.
Figure 17:
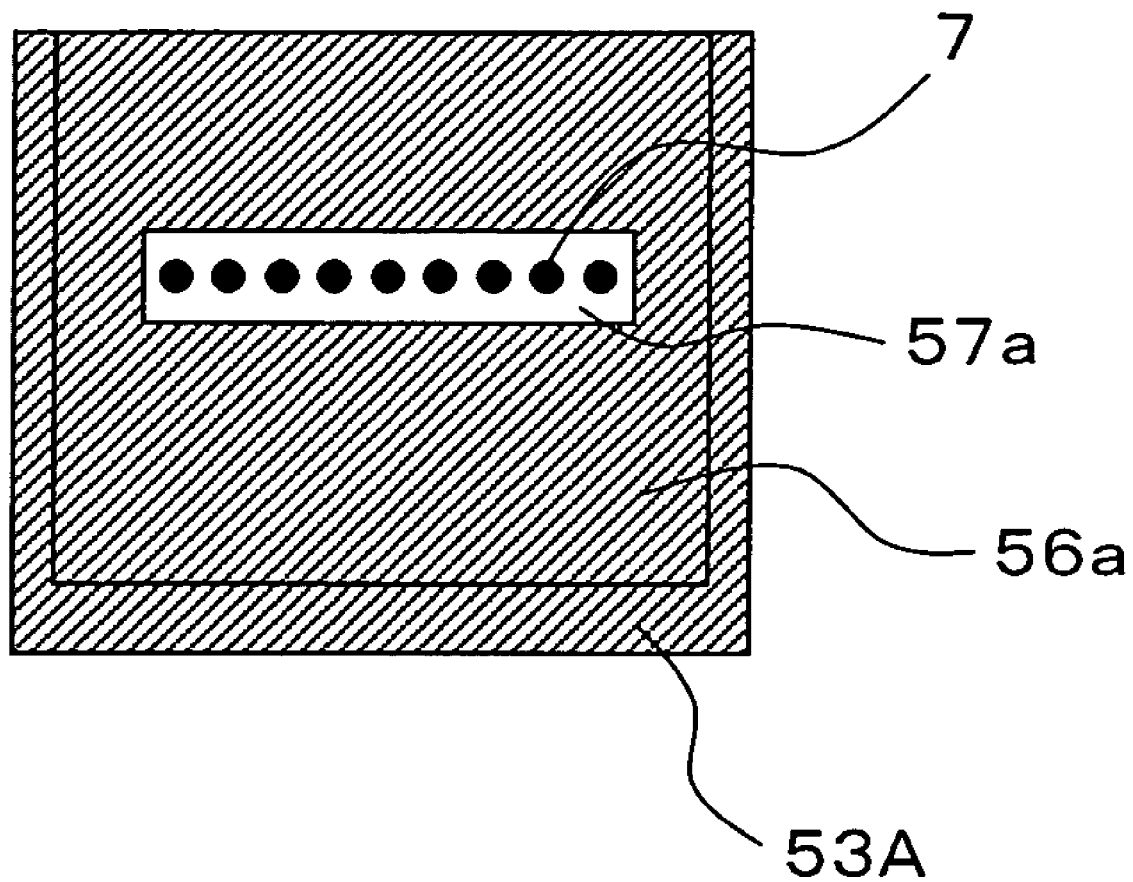
[FIG. 17] A view taken along an arrow X in FIG. 16.

FIG. 16 is a partial external appearance view of a multi-wire saw of Embodiment 7, and FIG. 17 is a view taken along an arrow X of FIG. 16.

The multi-wire saw of Embodiment 7 is the same as that of Embodiment 6 except for the slurry supply mechanism, so that the description of the same portions will be omitted.

In the multi-wire saw according to Embodiment 7, the slurry supply mechanism 8E is provided with a liquid tank 53A with a stirring mechanism 55 for holding a slurry 7, and two opposing side wall portions 56a, 56b, from among side surface portions as the surfaces constituting the liquid tank 53A are provided with slit-shaped passage holes 57a, 57b, respectively. The passage holes 57a, 57b are positioned below the liquid level of the slurry 7 when the slurry 7 is held in the liquid tank 53A. Further, as shown in FIG. 17, lines of the wire 7 passed over the main roller 24 and the sub-roller 27 are placed so as to pass through the slit-shaped passage holes 57a, 57b. Therefore, the lines of the wire 7 are guided in the slurry 7 while passing through the liquid tank 53A.

In the slurry supply mechanism 8E, the wire 5 enters the liquid tank 53A through one passage hole 57a. At this time, the slurry 7 is held in the liquid tank 53A. Therefore, the wire 5 comes into contact with the slurry 7 to supply the slurry 7 to the wire 5. The wire 5, to which the slurry 7 adheres to, is sent out of the liquid tank 53A from the passage hole 57b of the opposed side wall portion 56b, and the slurry 7 is transported to the cutting interface of the workpiece 3 owing to the travel of the wire 5.

A slight gap is formed between the passage hole 57a and the wire 5, and the slurry 5 leaks therefrom. In order to prevent the machining chamber 16 from being contaminated, and suppressing the adhesion of the slurry 7 to the opposed portion of the wire 5 wound in a spiral shape, it is preferable that a collecting tray 58 be provided in a lower portion of the liquid tank 53A.

Thus, according to Embodiment 7, the wire 5 does not travel on the wire guiding rollers 54a, 54b, 54c, and 54d. Therefore, the utilization efficiency of the slurry can be enhanced further. Furthermore, the requisite wire stretching operation is reduced, which enhances the workability.

In the same way as in Embodiment 6, as required, the liquid tank 53A may be provided with the stirring mechanism 55, the temperature control mechanism (not shown) for keeping the temperature constant, and the filter (not shown) for removing the cuttings of an ingot.

Furthermore, the passage holes 57a, 57b are provided on the opposed side surface portions 56a, 56b in the slurry supply mechanism 8E. The present invention is not limited thereto, and they may be provided on any side surface portion, as long as the wire 5 can be guided with respect to the slurry 7 in the liquid tank 53A. For example, a construction may be employed in which the cutting position of the workpiece 3 is placed above the liquid tank 53A, and a roller for changing the direction is provided in the liquid tank 53A, whereby the wire 5 is guided above the liquid tank 53A after entering from the side wall portion 56a.

Embodiment 8

The multi-wire saw of Embodiment 8 is the same as that of Embodiment 7, except for the slurry supply mechanism, so that the description of the same portions will be omitted.

Figure 18:
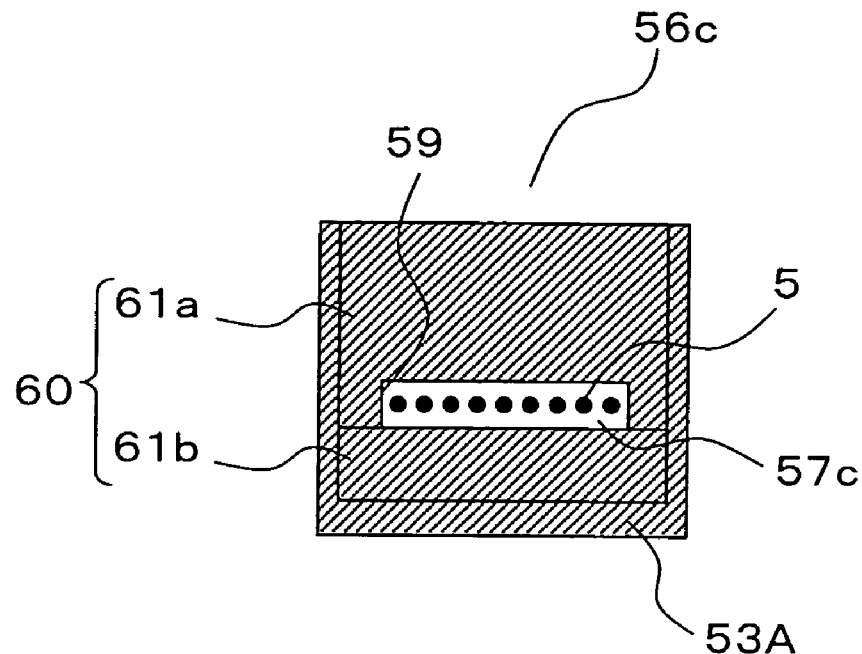
[FIG. 18] A view illustrating a side wall portion in a slurry supply mechanism of a multi-wire saw according to Embodiment 8 of the present invention.
Figure 18:
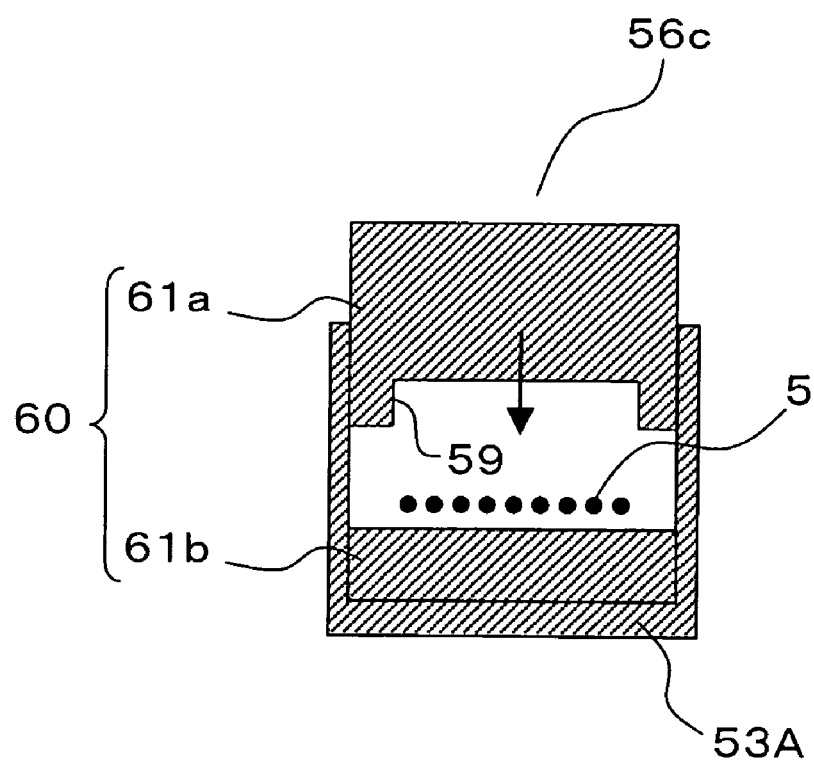

FIG. 18 illustrates a side wall portion in a slurry supply mechanism 8F of the multi-wire saw according to Embodiment 8. FIG. 18(A) is a view illustrating a closed state, and FIG. 18(B) is a view illustrating an open state.

In FIG. 18, a side wall portion 56c of the liquid tank 53A and a side wall portion (not shown) opposed thereto include an openable member 60 with a cutout portion 59. The openable member 60 is composed of an upper side wall member 61a provided with the cutout portion 59 and a lower side wall member 61b fixed to the liquid tank 53A. When the upper side wall member 61a is closed, the cutout portion 59 forms a passage hole 57c, as shown in FIG. 18(A).

In the slurry supply mechanism 8F, during a preparation operation of winding the wire 5 around the main roller 24 and the sub-roller 25 in a spiral shape, it is not necessary to pass the wire 5 through the passage hole 57c for every turn of the wire 5, which enhances the workability. More specifically, during a preparation operation of winding the wire 5, as shown in FIG. 5(B), the upper side wall member 61a only needs to be detached to allow the wire 5 to pass through the cutout portion 59. During cutting of the workpiece 3, the following only needs to be performed. That is, the upper side wall member 61a is closed again, forming the passage hole 57c, the slurry 7 is supplied to the liquid tank 53A, and thereafter, the workpiece 3 is cut as described in Embodiment 7.

When the machining precision is secured for respective contact surfaces of the upper side wall member 61*a*, the lower side wall member 61*b*, and the liquid tank 53A, or when a soft member (polytetrafluoroethylene resin, etc.) is used, the leakage of the slurry 7 can be sealed sufficiently only with mechanical fastening.

The invention claimed is:

1. A multi-wire saw for cutting a silicon ingot while supplying a slurry containing abrasive grains and an alkali or a mixed acid to a wire traveling between a plurality of rollers, comprising:

a slurry supply mechanism having an holding portion for holding the slurry and a temperature control mechanism for keeping the temperature of the slurry constant and adapted to supply the slurry to the wire as the wire passes through the holding portion which is provided on an upstream side of a site where the silicon ingot is cut; and a surface constituting the holding portion is provided with a passage hole allowing the wire to pass therethrough, wherein a surface constituting the holding portion has an openable member provided with a cutout portion, and when the member is closed, the cutout portion forms the passage hole.

2. A multi-wire saw according to claim 1, further comprising a plurality of wire guiding rollers for introducing the wire to the holding portion and for pulling up the wire from the holding portion.

3. A multi-wire saw according to claim 1, further comprising a stirring mechanism for stirring the slurry.

4. A multi-wire saw according to claim 1, wherein the stirring mechanism is provided on a bottom portion of the holding portion.

\* \* \* \* \*